(12) United States Patent
Yoshikawa

(10) Patent No.: US 7,298,005 B2
(45) Date of Patent: Nov. 20, 2007

(54) NONVOLATILE SEMICONDUCTOR MEMORY AND FABRICATION METHOD FOR THE SAME

(75) Inventor: Susumu Yoshikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 11/342,524

(22) Filed: Jan. 31, 2006

(65) Prior Publication Data

US 2007/0012989 A1    Jan. 18, 2007

(30) Foreign Application Priority Data

Jul. 12, 2005  (JP)  ............................. 2005-203318
Jan. 26, 2006  (JP)  ............................. 2006-017989

(51) Int. Cl.
*H01L 29/788* (2006.01)

(52) U.S. Cl. ....................... 257/315; 257/213; 257/288; 257/314; 257/E29.3; 438/142; 438/197; 438/257

(58) Field of Classification Search ..................... None
See application file for complete search history.

(56) References Cited

U.S. PATENT DOCUMENTS 6,696,742 B2 *   2/2004   Deml et al. ................. 257/510

FOREIGN PATENT DOCUMENTS

JP   7-183301   7/1995

* cited by examiner

*Primary Examiner*—Leonardo Andujar
*Assistant Examiner*—Kevin Quinto
(74) *Attorney, Agent, or Firm*—Oblon, Spivak, McClelland, Maier & Neustadt, P.C.

(57) ABSTRACT

A nonvolatile semiconductor memory includes a first and a second active area configured to extend in the column direction in parallel; an element isolating region configured to electrically separate the first and the second active area; a plurality of word lines configured to extend in the row direction and be constituted by respective main parts and respective ends; and a plurality of memory cell transistors configured to be disposed on intersections between the respective main parts of the plurality of word lines and the second active area. Each memory cell transistor comprises a gate insulating film, a floating gate electrode, an inter-gate insulating film, and a control gate electrode, constituting a memory cell array; a short-circuit region configured to electrically short circuit the ends of the plurality of word lines; and a trench configured to separate the ends from the main parts of the plurality of word lines.

20 Claims, 20 Drawing Sheets

NONVOLATILE SEMICONDUCTOR MEMORY AND FABRICATION METHOD FOR THE SAME

CROSS REFERENCE TO RELATED APPLICATIONS AND INCORPORATION BY REFERENCE

This application is based upon and claims the benefit of priority from prior Japanese Patent Applications P2005-203318 filed on Jul. 12, 2005 and P2006-17989 filed on Jan. 26, 2006, the entire contents of which are incorporated by reference herein.

BACKGROUND OF THE INVENTION

1. Field of the Invention

The present invention relates to a nonvolatile semiconductor memory and a fabrication method for the same. More specifically, it relates to a nonvolatile semiconductor memory including a word line electrode interconnect layer pattern for a memory cell array and a fabrication method for the same.

2. Description of the Related Art

An electrically data-erasable programmable read-only memory (EEPROM) is well-known as a nonvolatile semiconductor memory. The EEPROM, in particular, a NAND EEPROM includes a memory cell array comprising memory cells disposed on respective intersections of horizontal word lines and vertical bit lines. Typically, a memory cell is configured by, for example, a MOS transistor having a stacked gate structure of a floating gate and a control gate.

A NAND flash memory structure is provided by connecting multiple memory cell transistors in series, thereby creating a NAND string, and disposing select transistors on both sides of the NAND string. In addition, a memory cell array is configured by arranging element isolating regions in parallel with a memory cell element active area.

In order to ensure that a NAND flash memory cell array provides a lithographic margin for regions that are hard to provide periodicity of a word line end pattern, the line width in those regions is extended to be longer than line widths in the other regions, and thereby making the width of the spacing less than the minimum rule. However, recently, since the original minimum line width is narrow, use of such smaller pattern than the minimum line width is impossible. As a result, inter-interconnect short-circuits may easily occur.

A semiconductor device including a fine line and space pattern with narrower inter-line spacing than the line width has been disclosed. The device has wider adjacent inter-line spacing at the line end pattern than at the central pattern, thereby preventing inter-line short-circuits from occurring in the vicinity of line ends due to an optical intensity distribution produced by lithography process (See Japanese Patent Application Laid-Open No. Hei 7-183301).

SUMMARY OF THE INVENTION

An aspect of the present invention inheres in a nonvolatile semiconductor memory. The memory includes a first and a second active area configured to extend in the column direction thereof in parallel; an element isolating region configured to electrically separate the first and the second active area; a plurality of word lines configured to extend in the row direction; and a plurality of memory cell transistors configured to be disposed on intersections between the respective main parts of the plurality of word lines and the second active area. Each memory cell transistor comprises a gate insulating film, a floating gate electrode, an inter-gate insulating film, and a control gate electrode; a short-circuit region configured to electrically short circuit the ends of the plurality of word lines; and a trench configured to separate the ends from the main parts of the plurality of word lines.

Another aspect of the present invention inheres in a fabrication method for a nonvolatile semiconductor memory. The method includes providing a first and a second active area configured to extend in parallel in the column direction; electrically separate the first and the second active area by an element isolation region; extending a plurality of word lines in the row direction; and disposing a plurality of memory cell transistors on intersections between respective main parts of the plurality of word lines and an active area. Each memory cell transistor comprises a gate insulating film, a floating gate electrode, an inter-gate insulating film, and a control gate electrode, so as to provide a memory cell array; a short-circuit region configured to electrically short circuit the ends of the plurality of word lines; and a trench configured to separate the ends from the main parts of the plurality of word lines. The fabrication method includes fabricating a stacked layer structure of a nitride film, a metallic salicide film, the control gate electrode, the inter-gate insulating film, and the floating gate electrode, and short circuiting the ends of the plurality of word lines in the short-circuit region; coating a resist across the entire surface of an element region on a semiconductor substrate, and patterning the trench; etching the nitride film, the metallic salicide film, and the control gate electrode using the resist as a mask, and forming an aperture on the trench; and removing the resist.

DETAILED DESCRIPTION OF THE INVENTION

Figure 1:
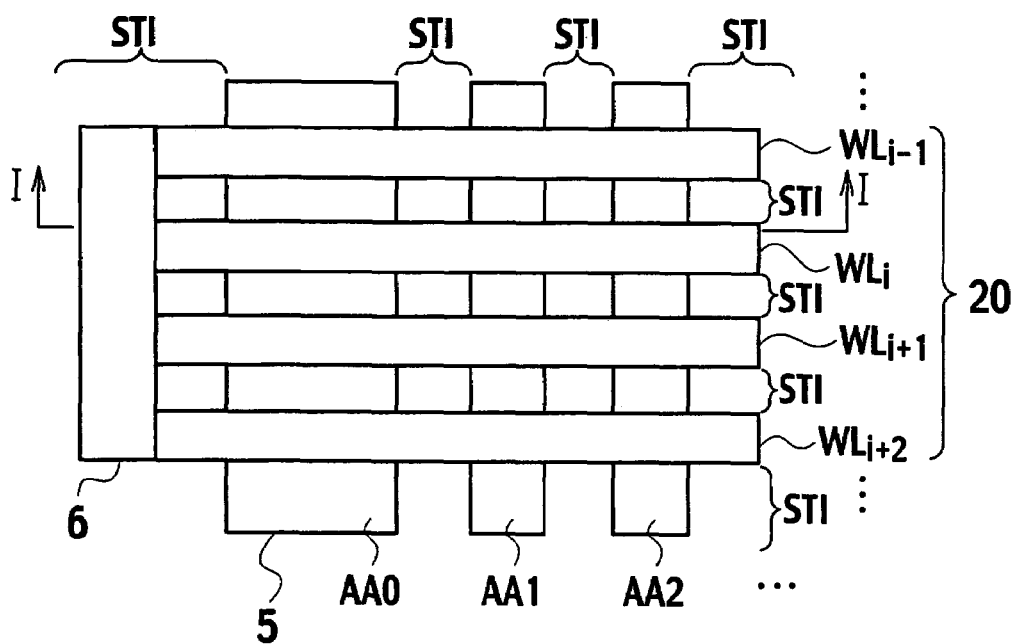
FIG. 1 schematically shows a planar pattern view describing a step in a nonvolatile semiconductor memory fabrication process according to a first embodiment of the present invention.
Figure 2:
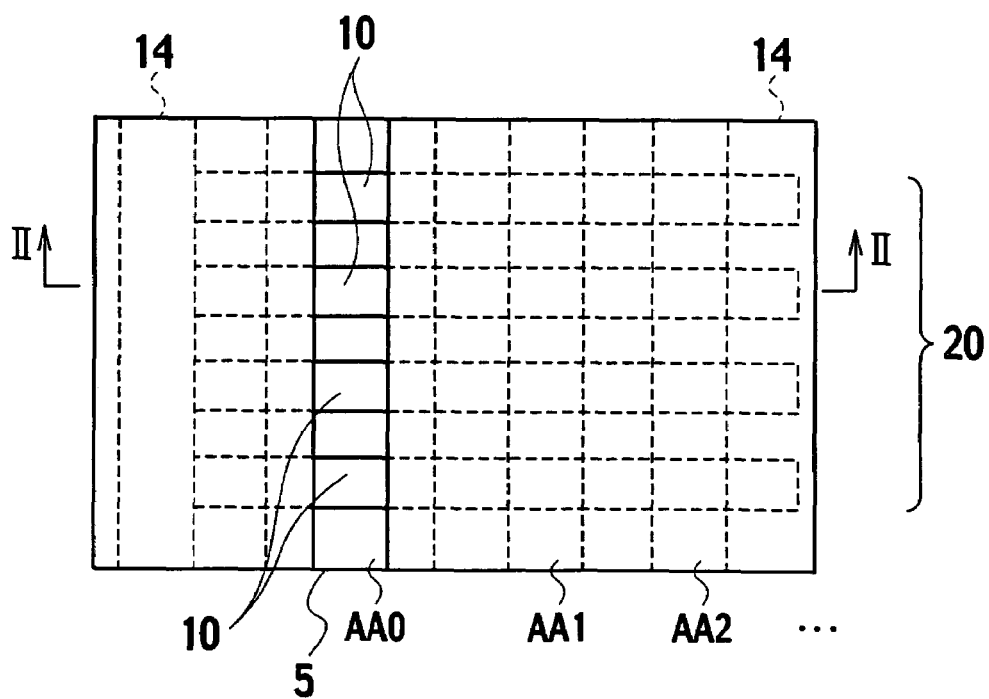
FIG. 2 schematically shows a planar pattern view describing a step in the nonvolatile semiconductor memory fabrication process according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order to not obscure the present invention with unnecessary detail.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

According to the nonvolatile semiconductor memory and the fabrication for the same according to the embodiments of the present invention, a nonvolatile semiconductor memory with an improved lithographic margin for ends of word line is provided.

COMPARATIVE EXAMPLE

A study example of the fundamental technology of the embodiments is described first.

Figure 27:
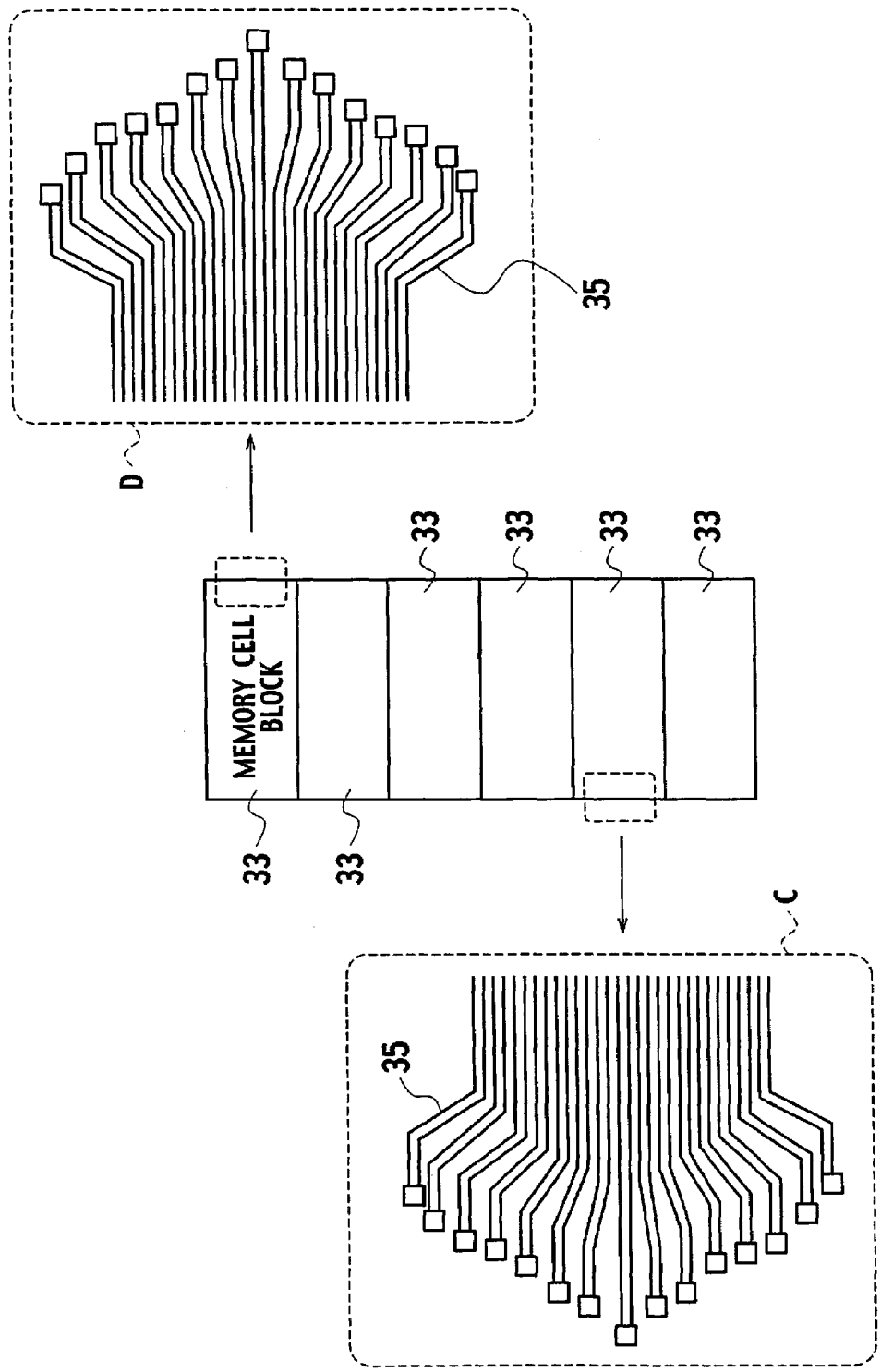
FIG. 27 schematically shows a planar view in the vicinity of a word line extension region of a memory cell block of a nonvolatile semiconductor memory according to a study example.
Figure 28:
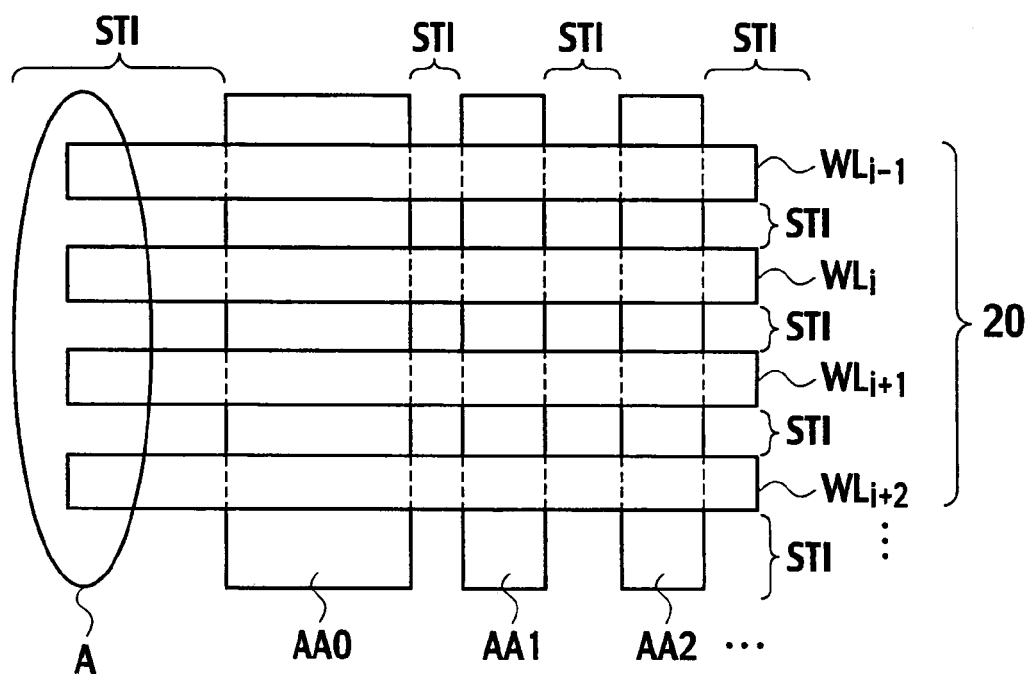
FIG. 28 schematically shows a planar view of ends of word line of the nonvolatile semiconductor memory according to the study example.

As schematically shown in a planar view of FIG. 27, in a NAND flash memory cell array, diagonal interconnect patterns 35 are used to form contact holes in the vicinity of peripheries of memory cell blocks 33, as magnified in C and D in the drawing. On the other hand, as shown in FIG. 28, regions (e.g., close regions indicated by A of FIG. 28) opposite to the interconnect patterns 35 for extending word lines (WL) 20 are arranged in a line and space (L/S) pattern in conformity with the minimum line width.

FIRST EMBODIMENT

Figure 3:
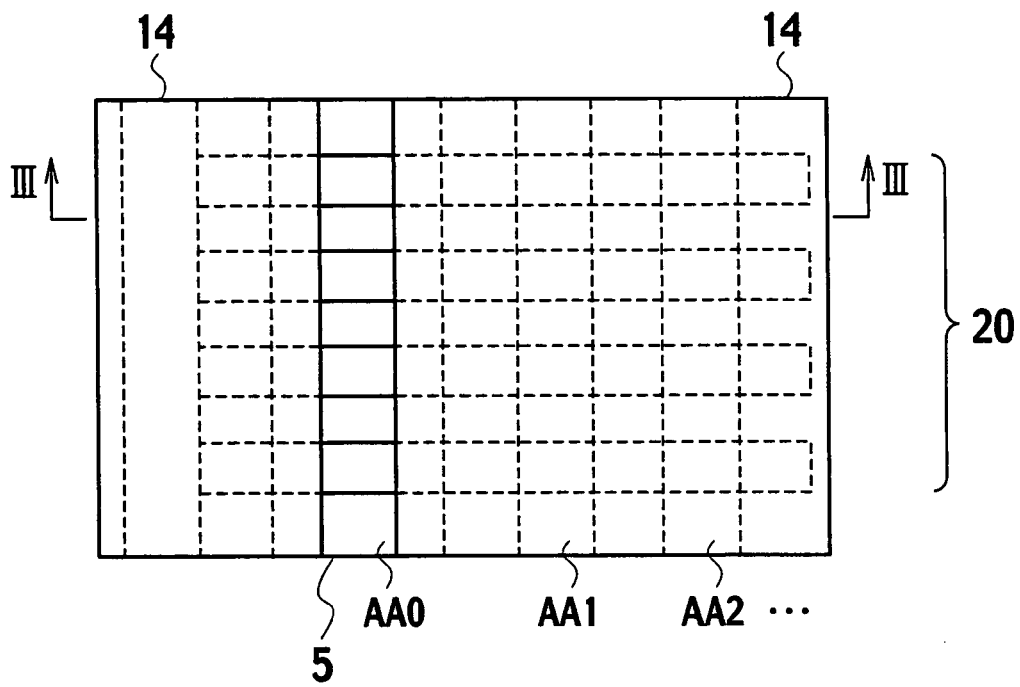
FIG. 3 schematically shows a planar pattern view describing a step of the nonvolatile semiconductor memory fabrication process according to the first embodiment of the present invention.
Figure 4:
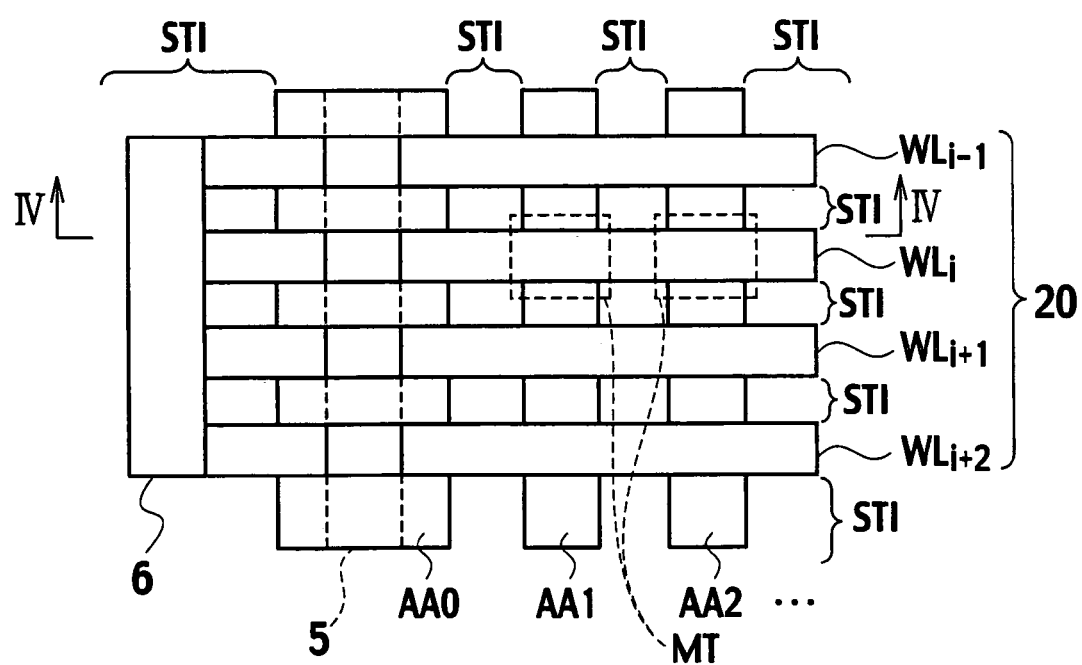
FIG. 4 schematically shows a planar pattern view describing a step of the nonvolatile semiconductor memory fabrication process according to the first embodiment of the present invention.

FIG. 4 schematically shows a planar pattern view of a nonvolatile semiconductor memory according to the first embodiment of the present invention. FIG. 8 schematically shows a cross-sectional structure of the nonvolatile semiconductor memory. In addition, FIGS. 1 through 3, and 5 through 7 schematically show planar pattern views and cross-sectional structures fabricated through a nonvolatile semiconductor memory fabrication process according to the first embodiment of the present invention, respectively.

Figure 5:
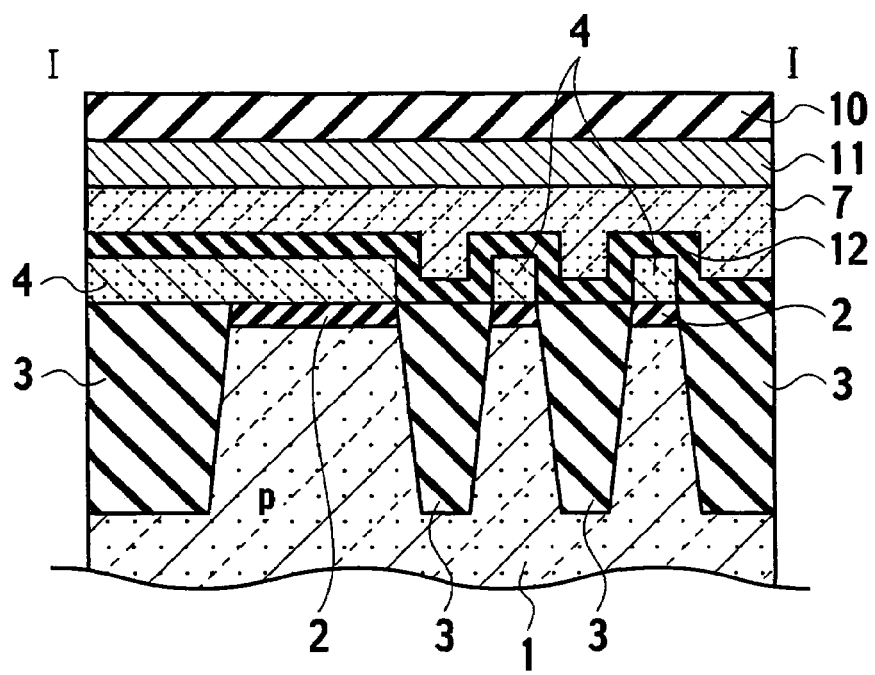
FIG. 5 schematically shows a cross-sectional structure cut along the line I-I of FIG. 1.
Figure 6:
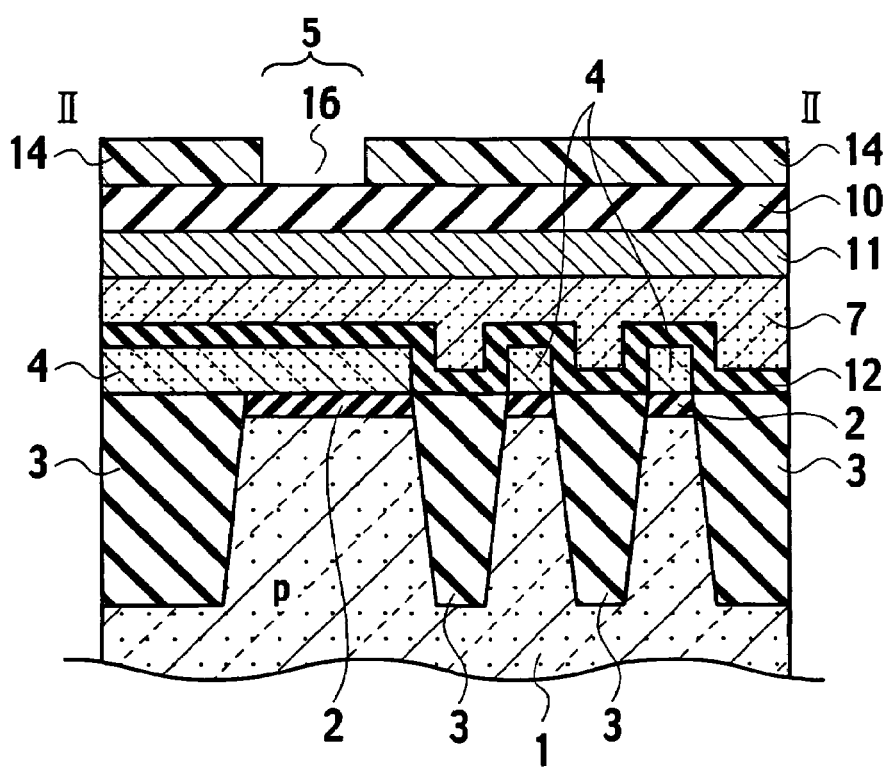
FIG. 6 schematically shows a cross-sectional structure cut along the line II-II of FIG. 2.
Figure 7:
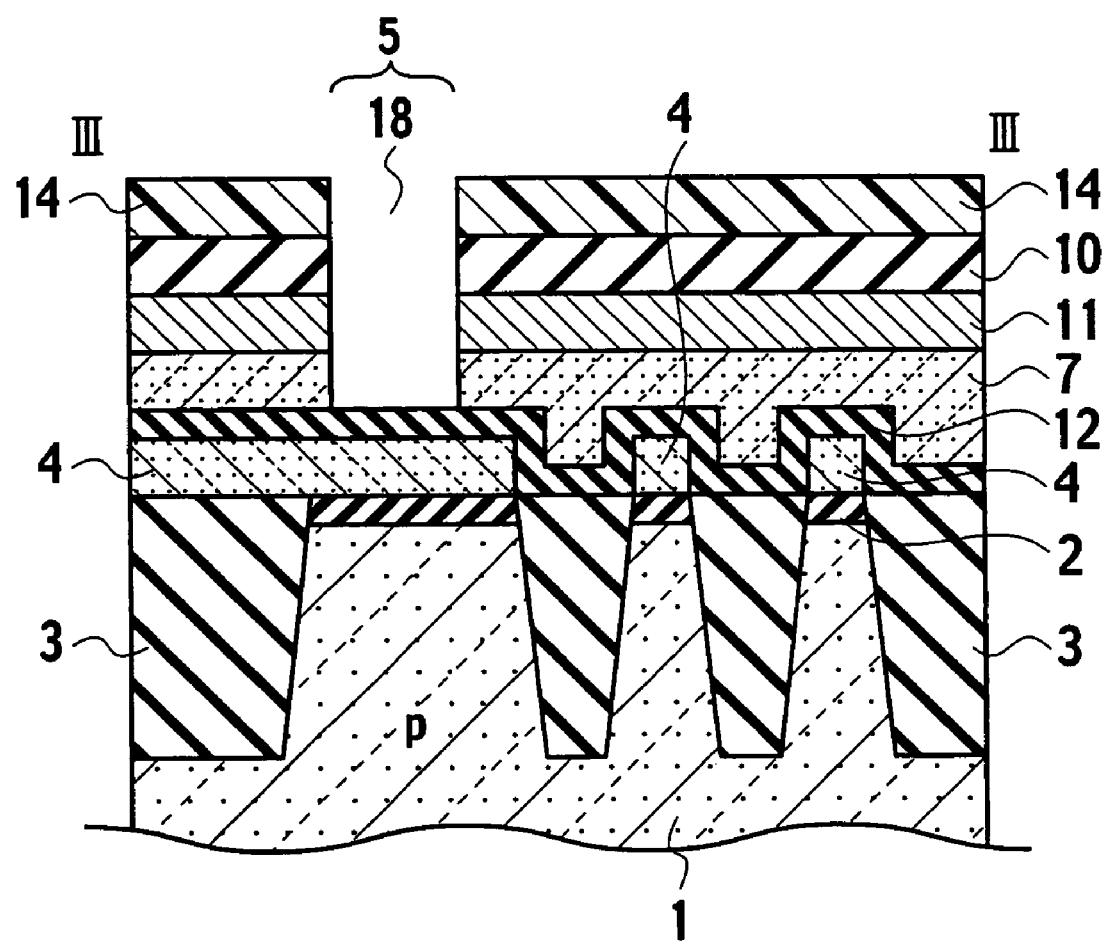
FIG. 7 schematically shows a cross-sectional structure cut along the line III-III of FIG. 3.
Figure 8A:
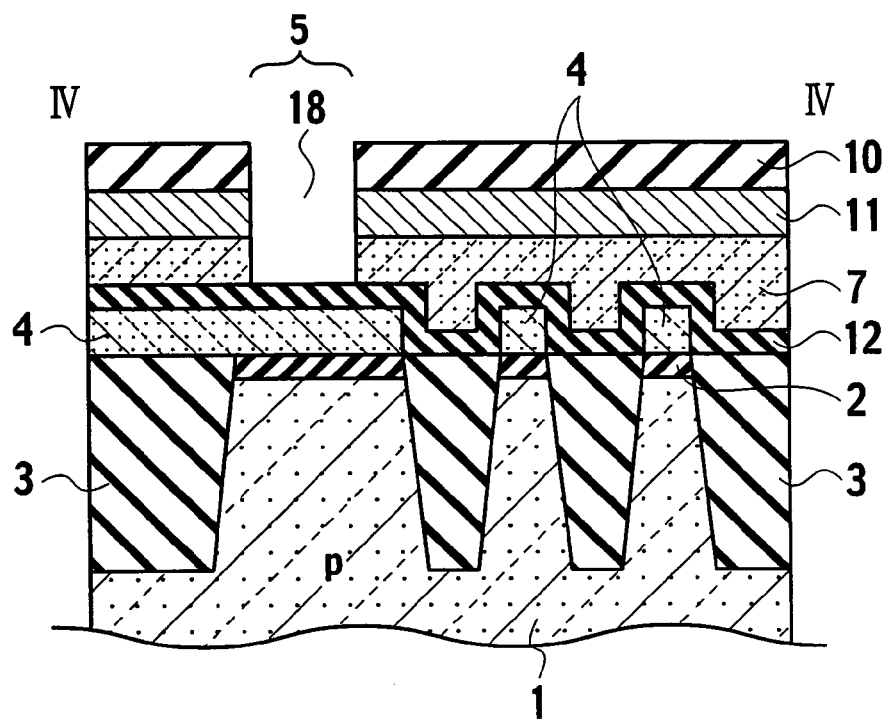
FIG. 8A schematically shows a cross-sectional structure cut along the line IV-IV of FIG. 4.

More specifically, FIG. 5 schematically shows a cross-sectional structure cut along the line I-I of FIG. 1; FIG. 6 schematically shows a cross-sectional structure cut along the line II-II of FIG. 2; FIG. 7 schematically shows a cross-sectional structure cut along the line III-III of FIG. 3; and FIG. 8A schematically shows a cross-sectional structure cut along the line IV-IV of FIG. 4. In particular, FIG. 8B schematically shows a cross-sectional structure of a self-aligned STI nonvolatile semiconductor memory according to the first embodiment of the present invention.

As shown in FIGS. 4 and 8, the nonvolatile semiconductor memory according to the first embodiment of the present invention includes: a first active area AA0 and second active areas AA1, AA2, AA3, . . . , which extend in parallel in the column direction thereof; element isolating regions (STI) 3, which electrically separate the first active area AA0 and the second active areas AA1, AA2, AA3, . . . ; multiple word lines 20, which extend in the row direction and have respective main parts and respective ends; multiple memory cell transistors MT, which are disposed on intersections between the respective main parts of the multiple word lines 20 and the respective second active areas AA1, AA2, AA3, . . . . Each memory cell transistor includes a gate insulating film 2, a floating gate electrode 4, a inter-gate insulating film 12, and a control gate electrode 7, constituting a memory cell array; a short-circuit region 6, which electrically short circuits the ends of the multiple word lines 20; and a trench represented as a CG patterning region 5, which separates the ends of the word lines from the main parts of the multiple word lines 20.

Alternatively, the short-circuit region 6 and the word lines 20 in the nonvolatile semiconductor memory according to the first embodiment of the present invention may be formed by being patterned at the same time.

Figure 8B:
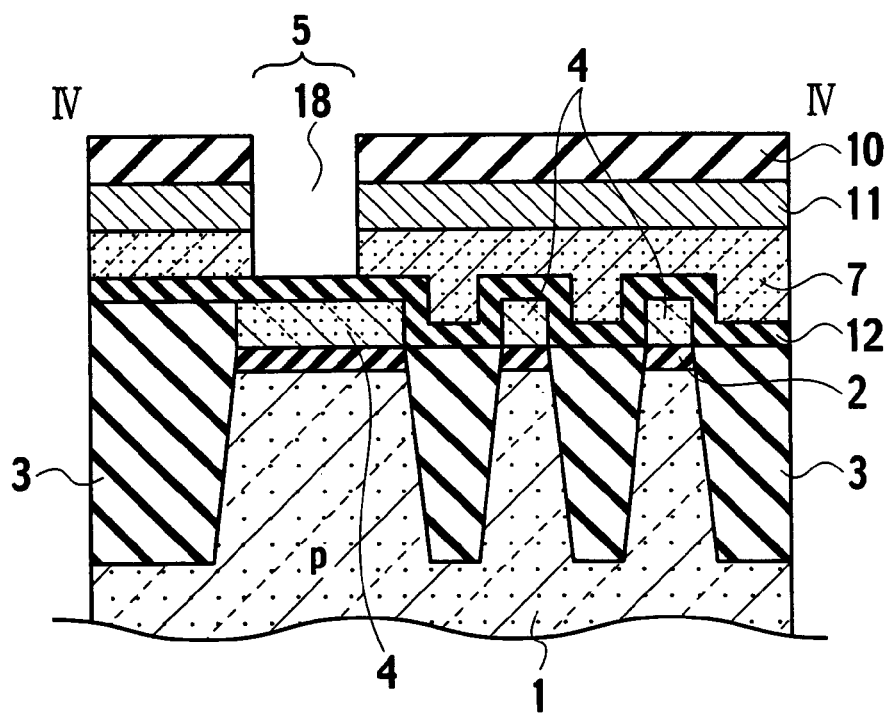
FIG. 8B schematically shows a cross-sectional structure of self-aligned STI nonvolatile semiconductor memory.

Alternatively, as shown in FIG. 8B, the element isolating region 3 and the floating gate electrode 4 in the nonvolatile semiconductor memory according to the first embodiment of the present invention may be formed on a self-aligned basis. In this case, the nonvolatile semiconductor memory serves as a self-aligned STI nonvolatile semiconductor memory. In other words, the nonvolatile semiconductor memory, such as self-aligned STI flash semiconductor memory, provided by etching a semiconductor substrate 1 and forming an element isolating pattern for formation of the element isolating region 3 and the floating gate electrode 4 on a self-aligned basis, has a structure in which the word lines 20 are at the ends of the memory cell array, which is short-circuited by the short-circuit region 6. The element isolating pattern for formation of the element isolating region 3 separates the control gate electrode 7 disposed on the memory cell array side from the short-circuit region 6.

In addition, according to the nonvolatile semiconductor memory of the first embodiment of the present invention, the CG patterning region 5 is formed right above the first active area AA0. In other words, in FIG. 8, an aperture 18 is formed on the first active area AA0.

As shown in FIG. 4, the short-circuit region 6 for intentionally making the word lines WLi−1, WLi, WLi+1, WLi+2, . . . short-circuit each other is formed at the ends of the word lines 20. The short-circuit region 6 for making the word lines WLi−1, WLi, WLi+1, WLi+2, . . . short-circuit each other permits an increase in the lithographic margin between the word lines WLi−1, WLi, WLi+1, WLi+2, . . . .

While the ends of the word lines WLi−1, WLi, WLi+1, WLi+2, . . . are short-circuited by the short-circuit region 6 by etching the control gate electrode 7, formation of the aperture 18 allows formation of the word lines WLi−1, WLi, WLi+1, WLi+2, . . . in a memory cell array without short-circuits.

Figure 17:
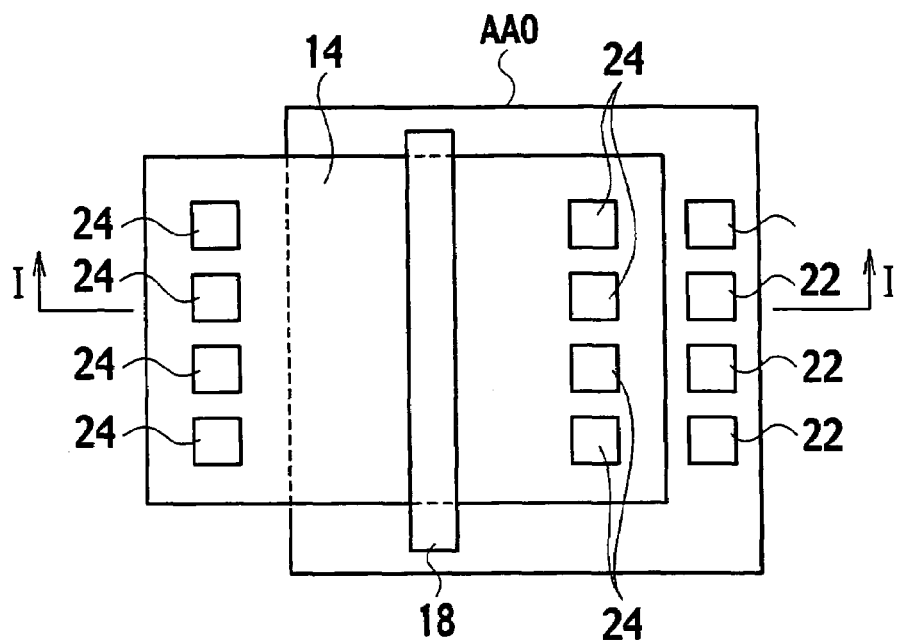
FIG. 17 schematically shows a planar pattern view describing a step of a self-aligned STI nonvolatile semiconductor memory fabrication process according to the first and the second embodiment of the present invention, in which inter-polysilicon capacitors (inter-poly capacitors) may be fabricated at the same time of the step of a self-aligned STI nonvolatile semiconductor memory fabrication process.
Figure 18:
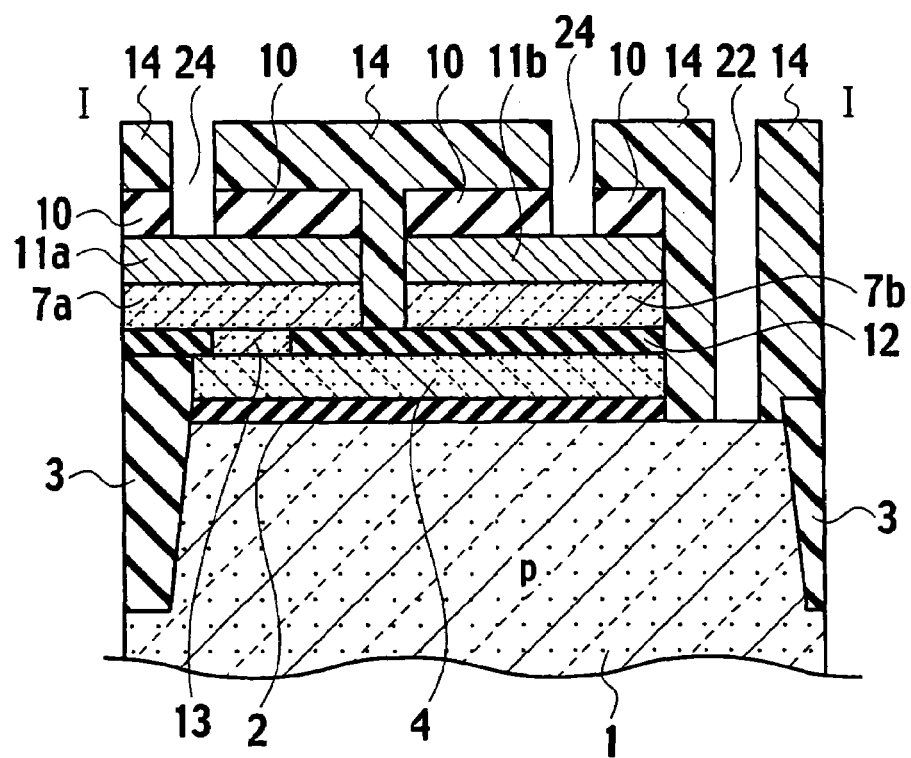
FIG. 18 schematically shows a cross-sectional structure cut along the line I-I of FIG. 17.

The CG patterning region 5 and an aperture 18 of an inter-polysilicon capacitor in a peripheral region shown in FIGS. 17 and 18 may be simultaneously formed through the same process. Alternatively, the CG patterning region 5 may be formed through the same process for an aperture 18 of a resistive element in a periphery region shown in FIGS. 19 and 20.

(Fabrication Method)

A nonvolatile semiconductor memory fabrication process according to the first embodiment of the present invention is described below using planar pattern views shown schematically in FIGS. 1 through 4 and cross-sectional structures schematically shown in FIGS. 5 through 8.

(a) In a fabrication process for word lines WLi−1, WLi, WLi+1, WLi+2, . . . , a SiN film 10, a metallic salicide film 11 made of WSi or the like, a control gate electrode 7 made of polysilicon, an inter-gate insulating film 12, and a floating gate electrode 4 made of polysilicon are fabricated. FIG. 1 schematically shows a planar pattern view while FIG. 5 schematically shows a cross-sectional structure after the fabrication process for the word lines WLi−1, WLi, WLi+1, WLi+2, . . . .

In this case, the ends of the word lines 20 are intentionally short-circuited by a short-circuit region 6. Whether or not the ends of the word lines 20 are short-circuited determines the lithographic margin.

Accordingly, short-circuiting the ends of the word lines 20, by patterning, increases the lithographic margin for the ends, and also increases the lithographic margin for the entire word lines WLi−1, WLi, WLi+1, WLi+2, . . . .

Figure 19:
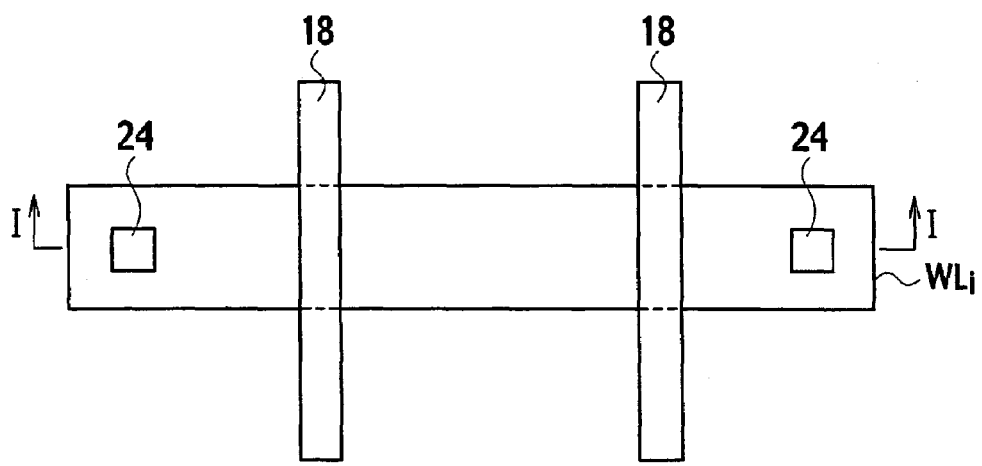
FIG. 19 schematically shows a planar pattern view describing a step of a self-aligned STI nonvolatile semiconductor memory fabrication process according to the first and the second embodiment of the present invention in which resistive elements may be formed at the same time of the step of a self-aligned STI nonvolatile semiconductor memory fabrication process.
Figure 20:
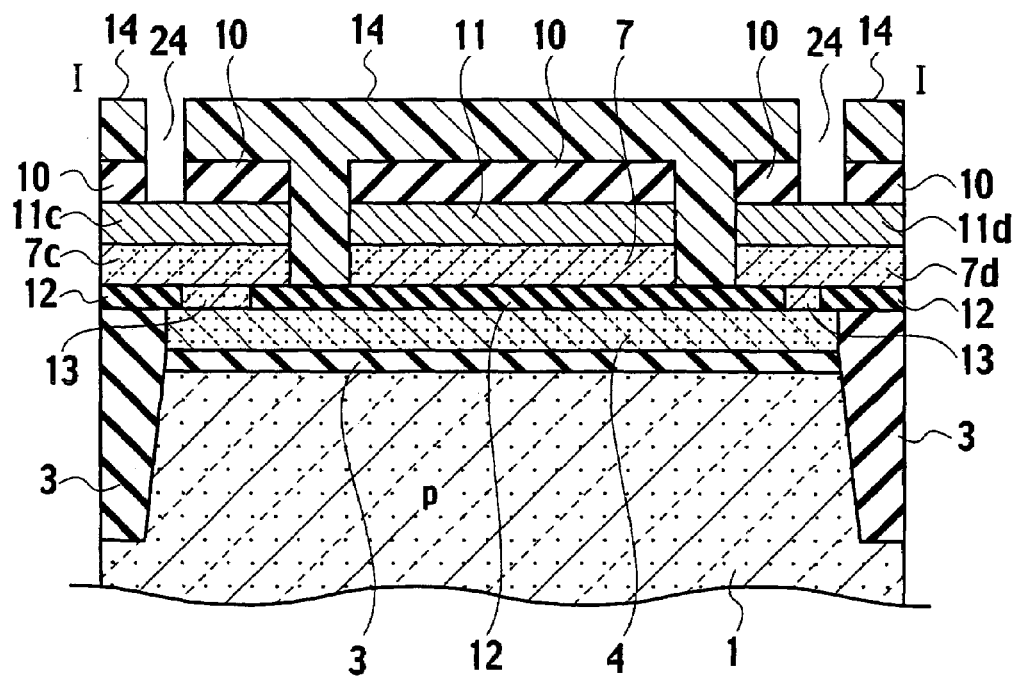
FIG. 20 schematically shows a cross-sectional structure cut along the line I-I of FIG. 19.

(b) A resist 14 is then coated on the entire surface of the device region of the semiconductor substrate 1. In a peripheral region of a memory cell array, inter-polysilicon capacitors (inter-poly capacitors) shown in FIGS. 17 and 18 and apertures 18 for respective resistive elements shown in FIGS. 19 and 20 are patterned, and a CG patterning region 5 is patterned at the same time.

(c) Afterwards, as shown in FIGS. 3 and 7, the SiN film 10, the metallic salicide film 11, and the control gate electrode 7, constituting the CG patterning region 5, are etched using the resist 14 as a mask, thereby forming the apertures 18. The CG patterning region 5 is formed on a first active area AA0.

Through this etching process, the metallic salicide film 11 and the control gate electrode 7 over the word lines WLi−1, WLi, WLi+1, WLi+2, . . . are separated by a pattern of the CG patterning region 5, thereby becoming discontinuous. Thus, the process electrically separates the word lines WLi−1, WLi, WLi+1, WLi+2, . . . in the memory cell array from the word lines WLi−1, WLi, WLi+1, WLi+2, . . . short-circuited by the short-circuit region 6 at the ends of the memory cell array.

Electrically separating the word lines WLi−1, WLi, WLi+1, WLi+2, . . . in the memory cell array from the word lines WLi−1, WLi, WLi+1, WLi+2, . . . , short-circuited by the short-circuit region 6 at the memory cell array ends, allows formation of the word lines WLi−1, WLi, WLi+1, WLi+2, . . . in the memory cell array and ensures a sufficient lithographic margin without short-circuits.

Such a pattern of the CG patterning region 5 provides an increased lithographic margin without short-circuiting the fine word lines WLi−1, WLi, WLi+1, WLi+2, . . . .

(d) Afterwards, as shown in FIGS. 4 and 8, the resist 14 coated on the entire surface of the device region of the semiconductor substrate 1 is removed.

(NAND Structure)

Figure 21:
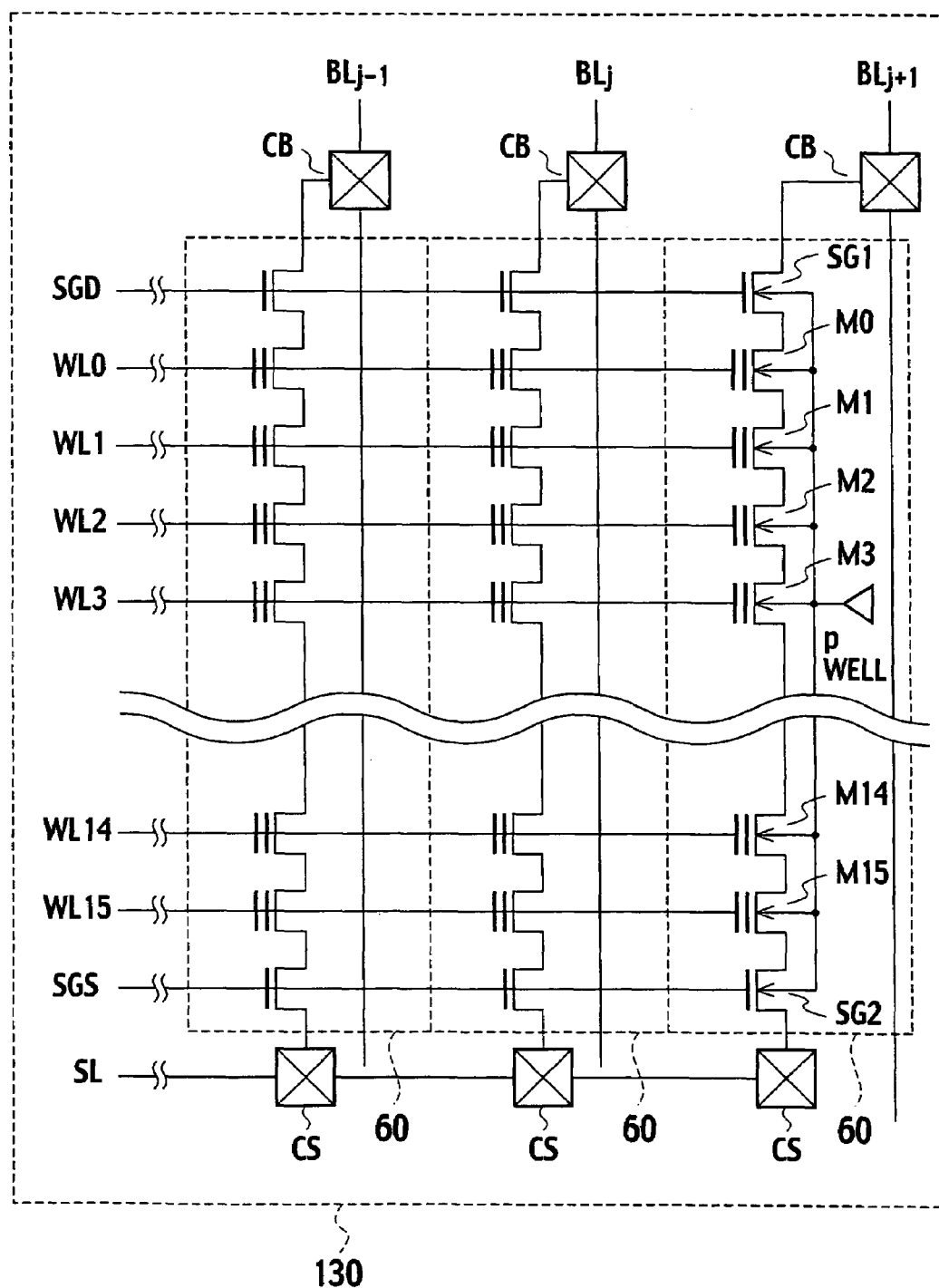
FIG. 21 schematically shows a NAND circuit structure in a memory cell array of the nonvolatile semiconductor memory according to the first embodiment of the present invention.

As shown in FIG. 21, a memory cell array 130 in a nonvolatile semiconductor memory according to the first embodiment of the present invention has a NAND circuit structure.

As shown in detail in FIG. 21, a NAND cell unit 60 comprises memory cell transistors M0 through M15 and select gate transistors SG1 and SG2. The drains of the respective select gate transistors SG1 are connected to respective bit lines BLj−1, BLj, BLj+1, . . . via respective bit line contacts CB, while the sources of the respective select gate transistors SG2 are connected to a shared source line SL via source line contacts CS.

The gates of respective select gate transistors SG1 are connected to a shared select gate line SGD, while the gates of the respective select gate transistors SG2 are connected to a shared select gate line SGS. In addition, the gates of the memory cell transistors M0 through M15 are connected to respective word lines WL0 through WL15. The select gate lines SGD and SGS are disposed in parallel with the respective word lines WL0 through WL15.

The exemplary nonvolatile semiconductor memory according to the first embodiment of the present invention has a basic structure of a NAND flash EEPROM, including a gate insulating film 2 formed on a p-well or a semiconductor substrate 1 as a tunnel insulating film, and a memory cell transistor having a stacked gate structure comprising a floating gate electrode 4, an inter-gate insulating film 12, and a control gate electrode 7 disposed upon the gate insulating film 2. Multiple memory cell transistors M0 through M15 are connected in series in the bit line direction via source and drain diffusion layers of each of the memory cell transistors M0 through M15, and the select gate transistors SG1 and SG2 are disposed at both ends of the multiple memory cell transistors M0 through M15 and connected to the bit line contacts CB and the source line contacts CS via the select gate transistors SG1 and SG2. As a result, a single NAND cell unit 60 is provided. Such NAND cell units 60 are arranged in parallel along the length of the word lines WL0, WL1, WL2, WL3, . . . , WL14, WL15, perpendicular to the bit lines BLj−1, BLj, BLj+1, . . . .

The lithographic margin is improved for ends of word lines 20, described using FIGS. 1 through 8, and is effective for providing the lithographic margin for the ends of the word lines WL0, WL1, WL2, WL3, . . . , WL14, WL15 in a memory cell array 130 of the NAND nonvolatile semiconductor memory shown in FIG. 21.

SECOND EMBODIMENT

Figure 11:
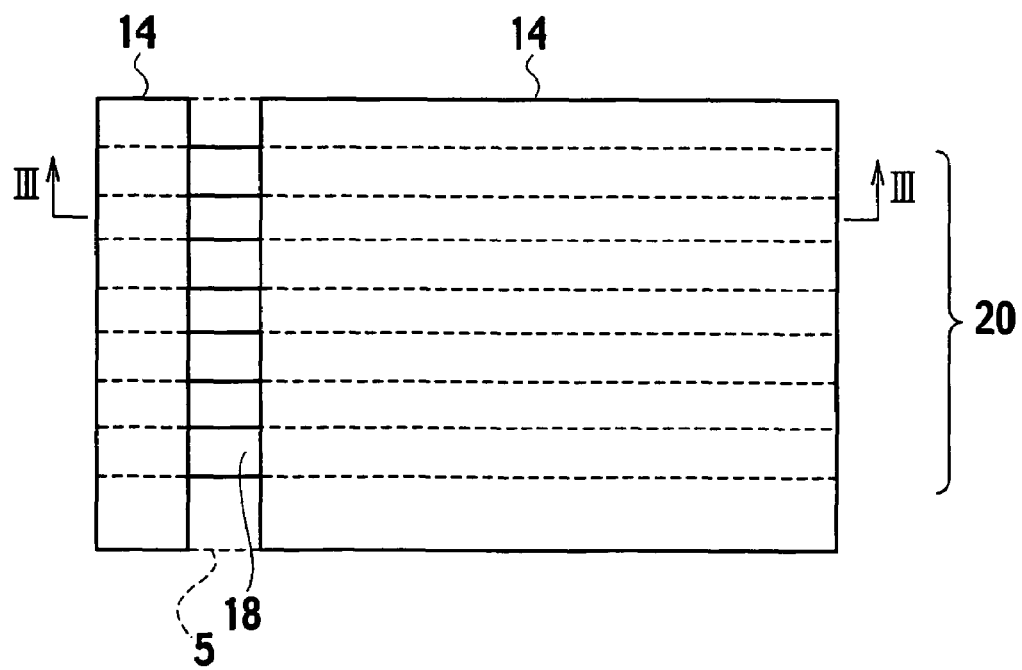
FIG. 11 schematically shows a planar pattern view describing a step of the nonvolatile semiconductor memory fabrication process according to the second embodiment of the present invention.
Figure 12:
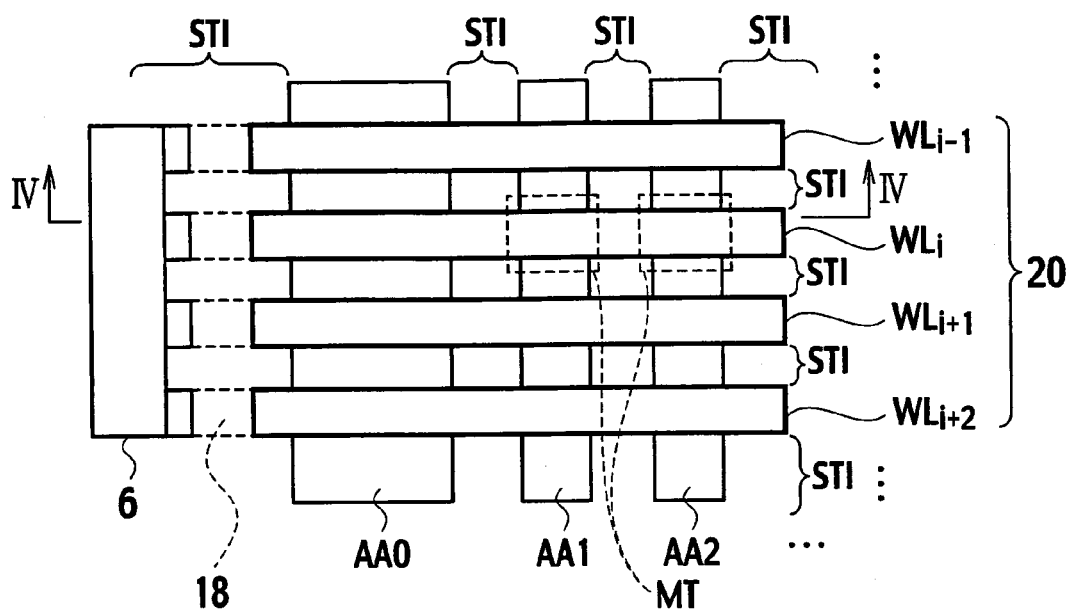
FIG. 12 schematically shows a planar pattern view describing a step of the nonvolatile semiconductor memory fabrication process according to the second embodiment of the present invention.

FIG. 12 schematically shows a planar pattern view of a nonvolatile semiconductor memory according to the second embodiment of the present invention. FIG. 16 schematically shows a cross-sectional structure of the nonvolatile semiconductor memory according to the second embodiment of the present invention. In addition, FIGS. 9 through 11, and 13 through 15 schematically show planar pattern views and cross-sectional structures fabricated through the nonvolatile semiconductor memory fabrication process according to the second embodiment of the present invention, respectively.

Figure 9:
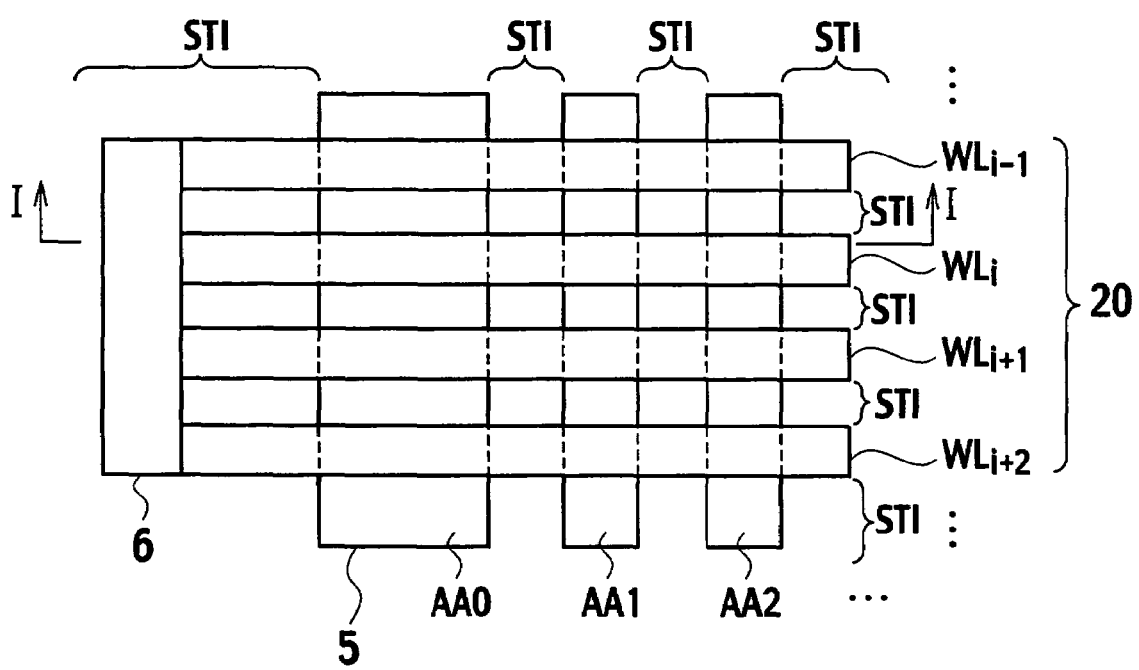
FIG. 9 schematically shows a planar pattern view describing a step of a nonvolatile semiconductor memory fabrication process according to a second embodiment of the present invention.
Figure 10:
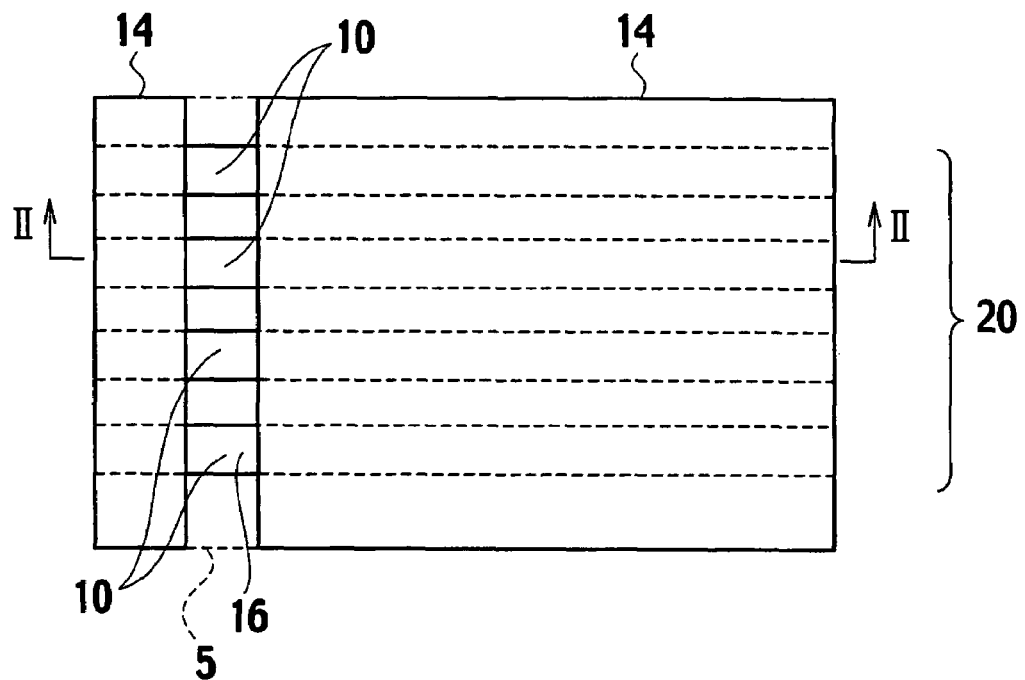
FIG. 10 schematically shows a planar pattern view describing a step of the nonvolatile semiconductor memory fabrication process according to the second embodiment of the present invention.
Figure 13:
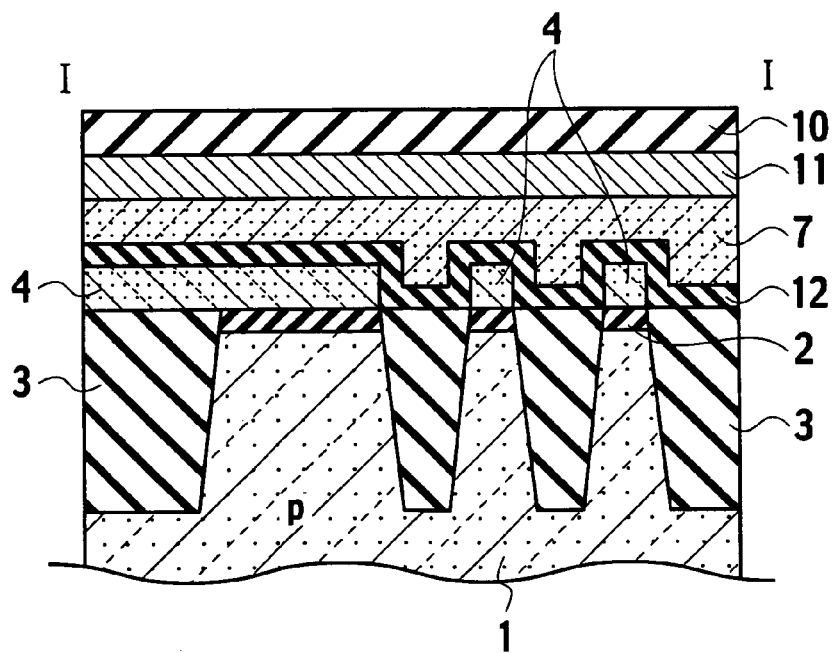
FIG. 13 schematically shows a cross-sectional structure cut along the line I-I of FIG. 9.
Figure 14:
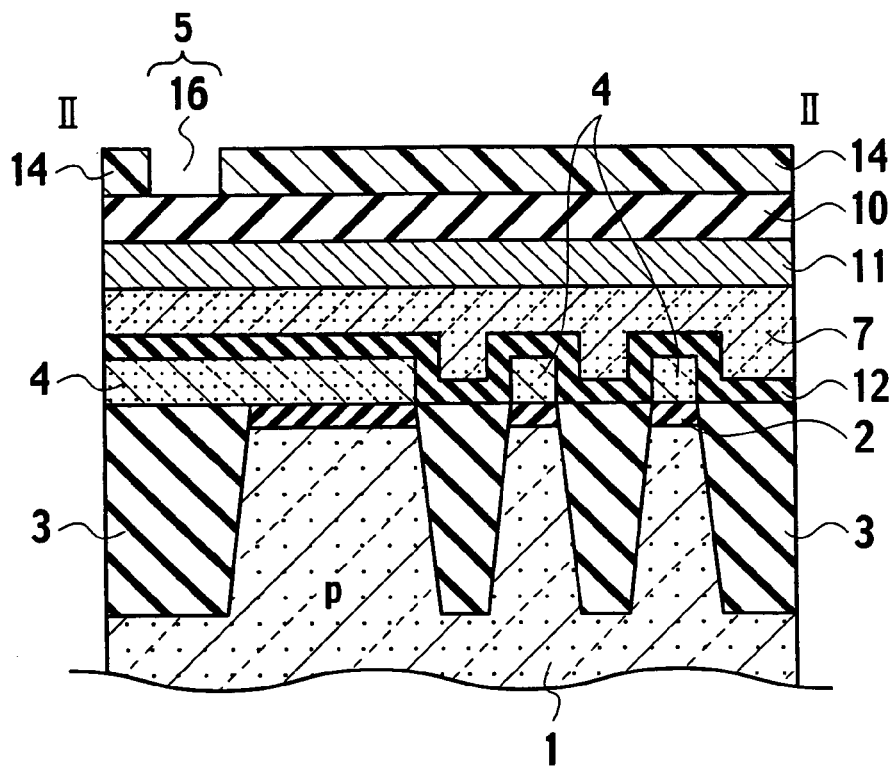
FIG. 14 schematically shows a cross-sectional structure cut along the line II-II of FIG. 10.
Figure 15:
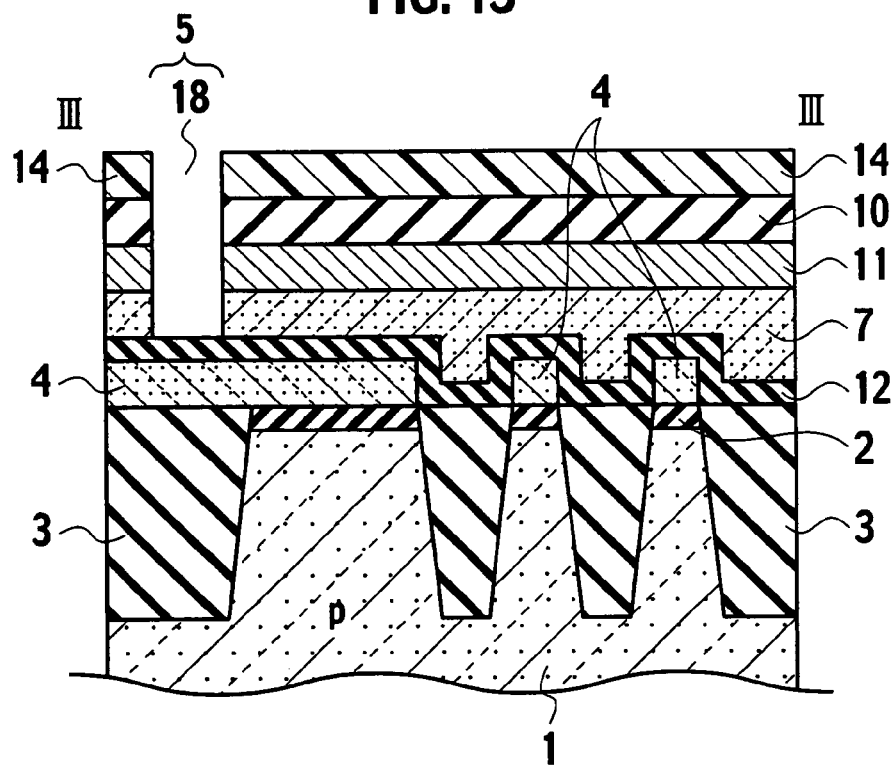
FIG. 15 schematically shows a cross-sectional structure cut along the line III-III of FIG. 11.
Figure 16A:
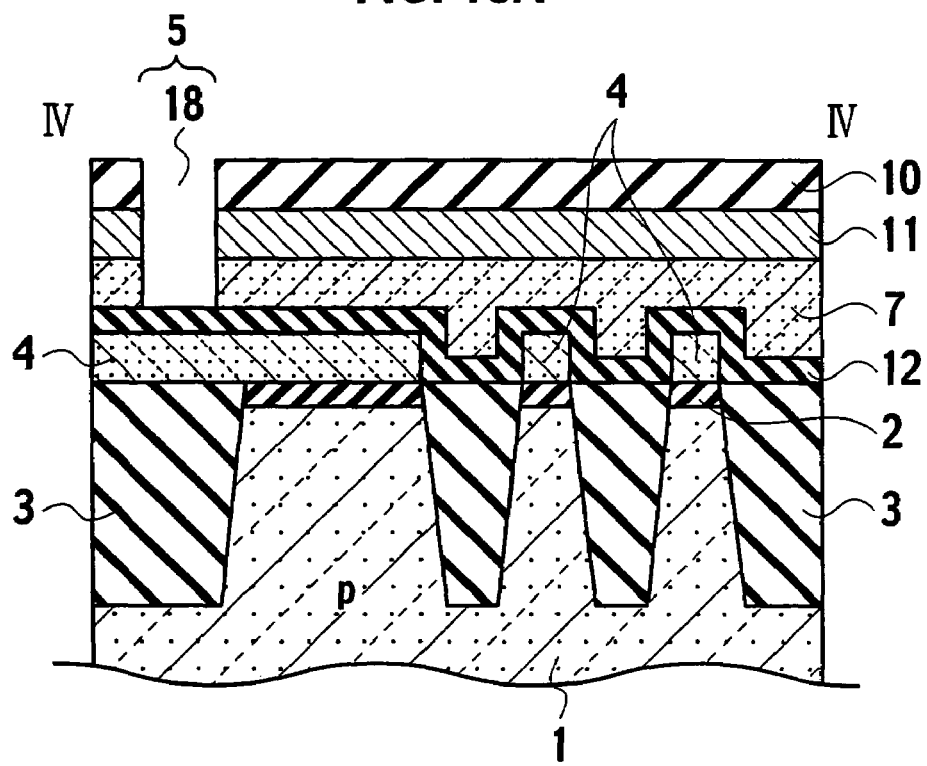
FIG. 16A schematically shows a cross-sectional structure cut along the line IV-IV of FIG. 12.
Figure 16B:
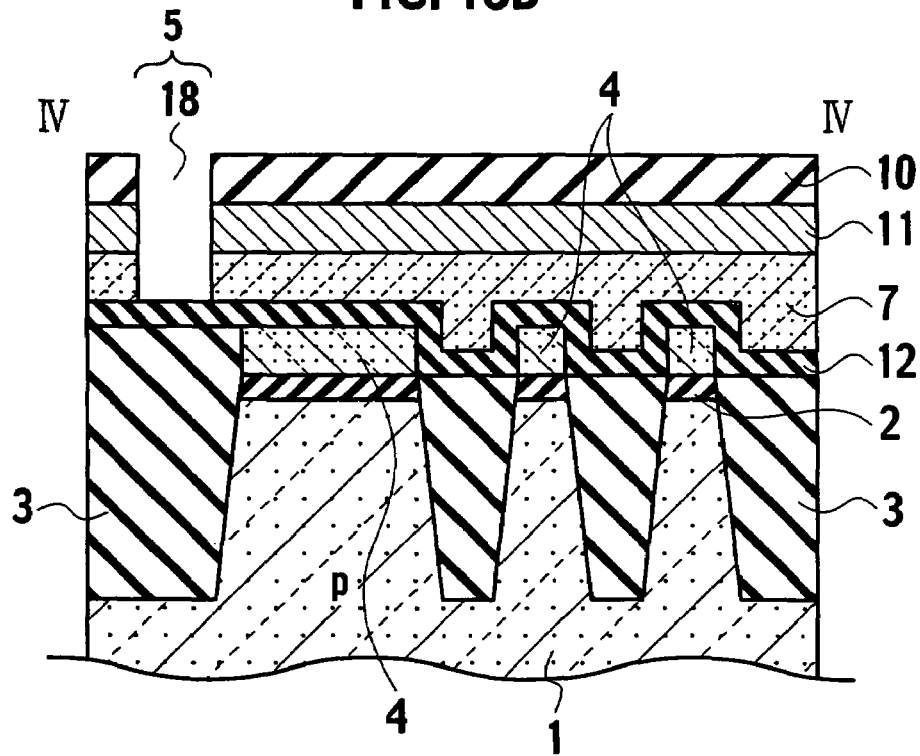
FIG. 16B schematically shows a cross-sectional structure of self-aligned STI nonvolatile semiconductor memory.

More specifically, FIG. 13 schematically shows a cross-sectional structure cut along the line I-I of FIG. 9; FIG. 14 schematically shows a cross-sectional structure cut along the line II-II of FIG. 10; FIG. 15 schematically shows a cross-sectional structure cut along the line III-III of FIG. 11; and FIG. 16A schematically shows a cross-sectional structure cut along the line IV-IV of FIG. 12. In particular, FIG. 16B schematically shows a cross-sectional structure of a self-aligned STI nonvolatile semiconductor memory according to the second embodiment of the present invention.

According to the nonvolatile semiconductor memory of the first embodiment of the present invention, an example of forming a CG patterning region 5 on an active area AA0 was described. Alternatively, as shown in FIGS. 12 and 16, according to the nonvolatile semiconductor memory of the second embodiment of the present invention, a CG patterning region 5 is formed right over an element isolating region 3.

As shown in FIGS. 12 through 16, the nonvolatile semiconductor memory according to the second embodiment includes: a first active area AA0 and second active areas AA1, AA2, AA3, . . . , which extend in parallel along the column length; element isolating regions (STI) 3, which electrically separate the first active area AA0 from the second active areas AA1, AA2, AA3, . . . ; multiple word lines 20, which extend along the row length and have respective main parts and respective ends; multiple memory cell transistors MT, which are disposed on intersections between the respective main parts of the multiple word lines 20 and the respective second active areas AA1, AA2, AA3, . . . . Each memory cell transistor includes a gate insulating film 2, a floating gate electrode 4, a inter-gate insulating film 12, and a control gate electrode 7, comprising a memory cell array; a short-circuit region 6, which electrically short circuits the ends of the multiple word lines 20; and a trench represented as a CG patterning region 5, which separates the ends of the multiple word lines 20 from the main parts of the multiple word lines 20.

Alternatively, the short-circuit region 6 and the word lines 20 in the nonvolatile semiconductor memory according to the second embodiment may be formed by being patterned at the same time.

Alternatively, as shown in FIG. 16B, the element isolating region 3 and the floating gate electrode 4 in the nonvolatile semiconductor memory according to the second embodiment may be formed on a self-aligned basis. In this case, the nonvolatile semiconductor memory serves as a self-aligned STI nonvolatile semiconductor memory. In other words, the nonvolatile semiconductor memory, such as a self-aligned STI flash semiconductor memory provided by etching a semiconductor substrate 1 and forming an element isolating pattern for formation of the element isolating region 3 and the floating gate electrode 4 formed on a self-aligned basis, is provided with the word lines WLi−1, WLi, WLi+1, WLi+2, . . . at the ends of the memory cell array short-circuited by the short-circuit region 6. The control gate electrode 7 on the memory cell array side from the short-circuit region 6 is patterned.

As shown in FIG. 12, the short-circuit region 6 for intentionally making the word lines WLi−1, WLi, WLi+1, WLi+2, . . . short-circuit each other is formed at the ends of the word lines 20. The short-circuit region 6 for making the word lines WLi−1, WLi, WLi+1, WLi+2, . . . short-circuit each other allows an increase in the lithographic margin for word lines WLi−1, WLi, WLi+1, WLi+2, . . . . While the ends of the word lines WLi−1, WLi, WLi+1, WLi+2, . . . are short-circuited by the short-circuit region 6 by etching the control gate electrode 7, formation of the aperture 18 allows formation of the word lines WLi−1, WLi, WLi+1, WLi+2, . . . in a memory cell array without short-circuiting each other.

The CG patterning region 5 and an aperture 18 of an inter-polysilicon capacitor in a peripheral region shown in FIGS. 17 and 18 may be simultaneously formed through the same process. Alternatively, the CG patterning region 5 may be formed through the same process as for an aperture 18 of a resistive element in a periphery region shown in FIGS. 19 and 20.

(Fabrication Method)

A fabrication process for the nonvolatile semiconductor memory according to the second embodiment is described below using planar pattern views schematically shown in FIGS. 9 through 12 and cross-sectional structures schematically shown in FIGS. 13 through 16.

(a) In a fabrication process for word lines WLi−1, WLi, WLi+1, WLi+2, . . . , a SiN film 10, a metallic salicide film 11 made of WSi, a control gate electrode 7 made of polysilicon, an inter-gate insulating film 12, and a floating gate electrode 4 made of polysilicon are fabricated. FIG. 9 schematically shows a planar pattern view while FIG. 16 schematically shows a cross-sectional structure after fabrication process for the word lines WLi−1, WLi, WLi+1, WLi+2, . . . .

In this case, the ends of the word lines 20 are intentionally short-circuited by a short-circuit region 6. Whether or not the ends of the word lines 20 are short-circuited determines the lithographic margin.

Accordingly, short-circuiting the ends of the word lines 20 through patterning increases the lithographic margin for the ends, and also increases the lithographic margin for the entire word lines WLi−1, WLi, WLi+1, WLi+2, . . . .

(b) A resist 14 is then coated on the entire surface of a device region of the semiconductor substrate 1. In a peripheral region of a memory cell array, inter-polysilicon capacitors (inter-poly capacitors) shown in FIGS. 17 and 18, and apertures 18 for respective resistive elements shown in FIGS. 19 and 20 are patterned, and a CG patterning region 5 is patterned at the same time.

(c) Afterwards, as shown in FIGS. 11 and 15, the SiN film 10, the metallic salicide film 11, and the control gate electrode 7 comprising the CG patterning region 5 are etched using the resist 14 as a mask, thereby forming the apertures 18.

Through the described etching process, the metallic salicide film 11 and the control gate electrode 7 are separated by a pattern of the CG patterning region 5, so as to be discontinuous, and electrically separating the word lines WLi−1, WLi, WLi+1, WLi+2, . . . in the memory cell array from the word lines WLi−1, WLi, WLi+1, WLi+2, . . . short-circuited by the short-circuit region 6 at the memory cell array ends.

Electrically separating the word lines WLi−1, WLi, WLi+1, WLi+2, . . . in the memory cell array from the word lines WLi−1, WLi, WLi+1, WLi+2, . . . , short-circuited by the short-circuit region 6 at the memory cell array ends, allows formation of the word lines WLi−1, WLi, WLi+1, WLi+2, . . . in the memory cell array while ensuring a sufficient lithographic margin without short-circuits.

Such a pattern of the CG patterning region 5 allows an increase in the lithographic margin without short-circuiting the fine word lines WLi−1, WLi, WLi+1, WLi+2, . . . .

(d) Afterwards, as shown in FIGS. 12 and 16, the resist 14 coated on the entire surface of the device region of the semiconductor substrate 1 is removed.

As shown in FIG. 21, a memory cell array 130 in the nonvolatile semiconductor memory according to the second embodiment has a NAND circuit structure as in the first embodiment.

Improvement in the lithographic margin for ends of word lines 20, described using FIGS. 9 through 16, may be effective for providing a lithographic margin for ends of the word lines WL0, WL1, WL2, WL3, . . . , WL14, WL15 in a memory cell array 130 of the NAND nonvolatile semiconductor memory shown in FIG. 21.

(Exemplified Structure of Inter-Polysilicon Capacitor)

FIGS. 17 and 18 schematically show a planar pattern view and a cross-sectional structure of an inter-polysilicon capacitor (inter-poly capacitor), respectively, which can be simultaneously formed through the nonvolatile semiconductor memory fabrication process according to the first and the second embodiment of the present invention. FIG. 18 schematically shows a cross-sectional structure cut along the line I-I of FIG. 17.

FIGS. 17 and 18 are process diagrams after formation of apertures 22 and 24 on a resist 14. Control gate electrodes 7a and 7b and metallic salicide films 11a and 11b are separated by respective apertures 18. The apertures 24 are formed by patterning a SiN film 10 while the apertures 22 are formed by patterning a sidewall insulating film 28.

An inter-polysilicon capacitor (inter-poly capacitor) may be fabricated by forming electrodes in the respective apertures 24 and making the electrodes contact the respective metallic salicide films 11a and 11b, separated by the aperture 18, after removal of the resist 14. In other words, the process provides for formation of an inter-polysilicon capacitor (inter-poly capacitor) including an electrode comprising the control gate electrode 7a and the metallic salicide film 11a electrically connected to the floating gate electrode 4 via an inter-gate polysilicon layer 13, an inter-gate insulating film 12 used as an inter-electrode insulating film for forming a capacitor, and another electrode comprising the control gate electrode 7b and the metallic salicide film 11b.

(Exemplified Structure of Resistive Element)

FIGS. 19 and 20 schematically show a planar pattern view and a cross-sectional structure of a resistive element, respectively, which can be simultaneously formed through the nonvolatile semiconductor memory fabrication processes according to the first and the second embodiment of the present invention, respectively. FIG. 20 schematically shows a cross-sectional structure cut along the line I-I of FIG. 19.

FIGS. 19 and 20 are process diagrams after formation of apertures 24 on a resist 14. Control gate electrodes 7c and 7d, and metallic salicide films 11c and 11d are separated by respective apertures 18. The apertures 24 are formed by patterning a SiN film 10.

A resistive element may be fabricated by forming electrodes in the respective apertures 24 and making the electrodes contact the respective metallic salicide films 11c and 11d separated by the aperture 18 after removal of the resist 14. In other words, a resistive element is formed having as one electrode the control gate electrode 7c and the metallic salicide film 11c electrically connected to the floating gate electrode 4 via an inter-gate polysilicon layer 13, and having as the other electrode the control gate electrode 7d and the metallic salicide film 11d, and also having the floating gate electrode 4 as a polysilicon layer for forming a resistive element.

THIRD EMBODIMENT (AND Structure)

Figure 22:
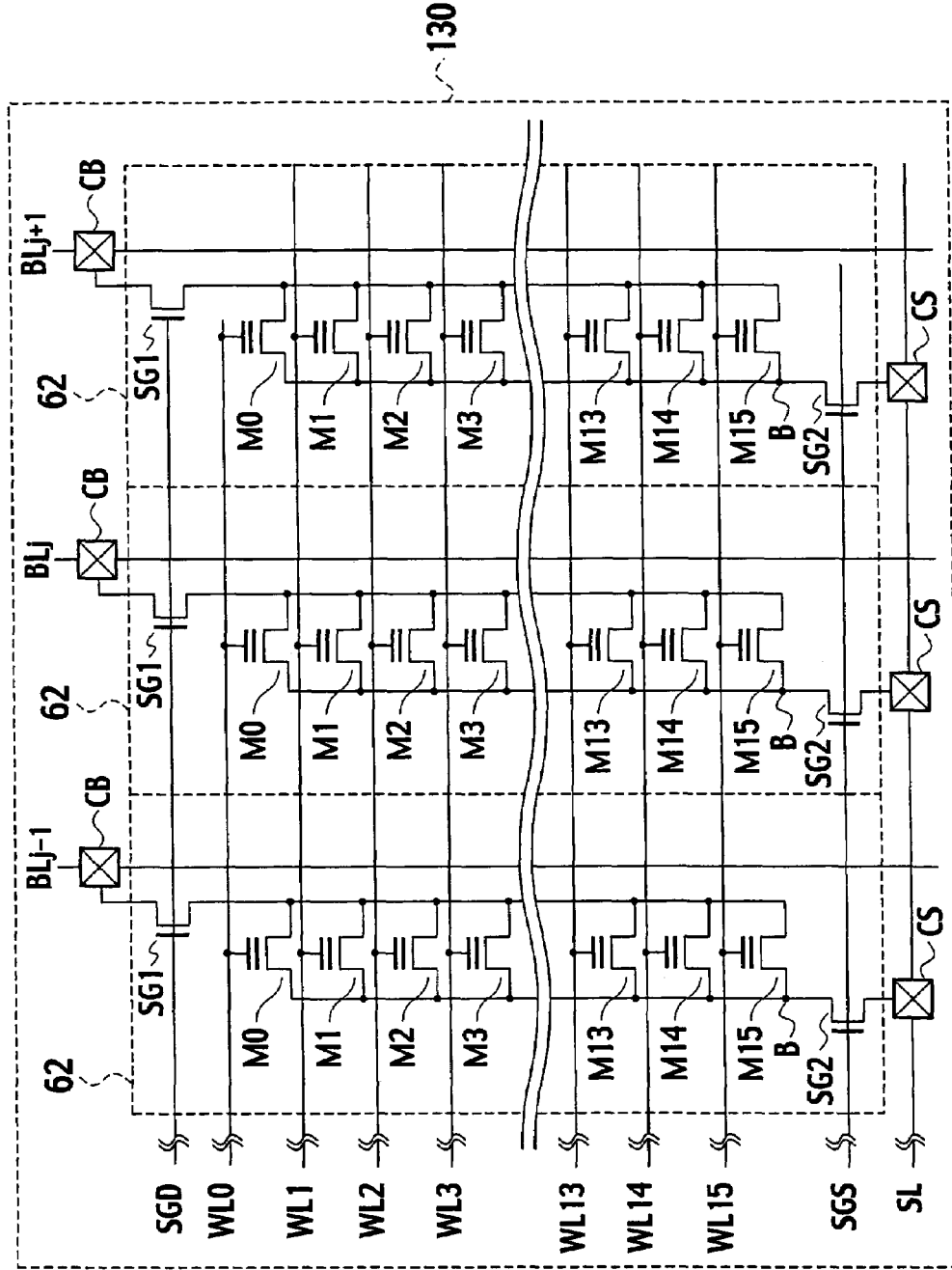
FIG. 22 schematically shows a NAND circuit structure in a memory cell array of nonvolatile semiconductor memory according to a third embodiment of the present invention.

As shown in FIG. 22, a schematic circuit structure of a memory cell array 130, according to the third embodiment of the present invention, is an AND nonvolatile semiconductor memory.

The AND nonvolatile semiconductor memory, shown in FIG. 22, comprises a basic structure of a memory cell transistor with a stacked gate structure.

The AND cell units 62 comprise memory cell transistors M0 through M15 connected in parallel and select gate transistors SG1 and SG2, as shown in detail in FIG. 22. The drains of the select gate transistors SG1 are connected to the bit lines . . . , $BL_{j-1}$, $BL_j$, $BL_{j+1}$, . . . via respective bit line contacts CB. The sources of the select gate transistors SG2 are connected to the common source line SL via respective source line contacts CS.

An AND cell unit is indicated at 62, within the dotted line of FIG. 22. In each AND cell unit 62, the drain regions of the memory cell transistors M0 through M15 are commonly connected and the source regions thereof are also commonly connected. Word lines WL1 through WL15 are connected to the respective gates of the memory cell transistors M0 through M15. A select gate line SGD is connected to the gates of respective select gate transistors SG1, and a select gate line SGS is connected to the gates of respective select gate transistors SG2.

It is apparent that the effects of improved lithographic margins at word line ends, as in the NAND nonvolatile semiconductor memory according to the first and the second embodiment, may also be expected for an interconnect pattern of word line ends in a memory cell array 130 comprising an AND nonvolatile semiconductor memory according to the third embodiment of the present invention.

FOURTH EMBODIMENT (NOR Structure)

Figure 23:
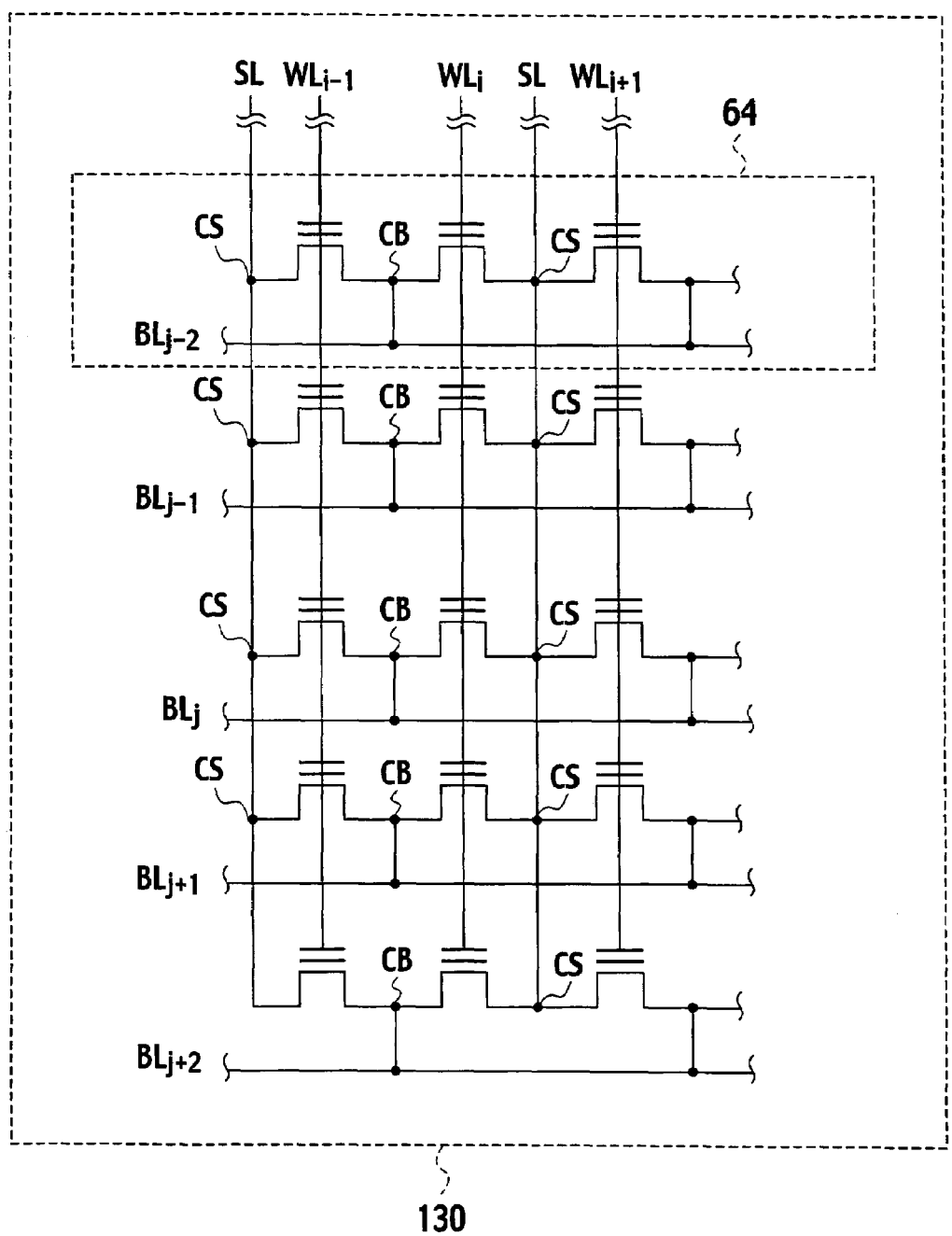
FIG. 23 schematically shows a NOR circuit structure in a memory cell array of a nonvolatile semiconductor memory according to a fourth embodiment of the present invention.

As shown in FIG. 23, a schematic circuit structure of a memory cell array 130, according to the fourth embodiment of the present invention, provides a circuit of a NOR nonvolatile semiconductor memory.

The NOR nonvolatile semiconductor memory shown in FIG. 23 comprises a memory cell transistor with a stacked gate structure.

A NOR cell unit is shown at 64 and is enclosed by a dotted line in FIG. 32. In each NOR cell unit 64, the common source region of two adjacent memory cell transistors is connected to a source line SL via a source line contact CS, and the common drain region is connected to bit lines $BL_{j-2}$, $BL_{j-1}$, $BL_j$, $BL_{j+1}$, $BL_{j+2}$ via a bit line contact CB. The NOR cell unit 64 is arranged along the length of word lines $WL_{i-1}$, $WL_i$, $WL_{i+1}$, . . . orthogonal to the bit lines $BL_{j-2}$, $BL_{j-1}$, $BL_j$, $BL_{j+1}$, $BL_{j+2}$, . . . , and memory cell transistor gates are commonly connected to the respective word lines $WL_{i-1}$, $WL_i$, $WL_{i+1}$, . . . . The nonvolatile semiconductor memory with the NOR circuit structure allows faster reading than the NAND structure.

It is apparent that the effects of improved lithographic margins at word line ends, as in the NAND nonvolatile semiconductor memory according to the first and the second embodiment of the present invention, may also be expected for an interconnect pattern of word line ends in a memory cell array 130 comprising NOR nonvolatile semiconductor memory according to the fourth embodiment of the present invention.

FIFTH EMBODIMENT (Two-Transistor/Cell Type)

Figure 24:
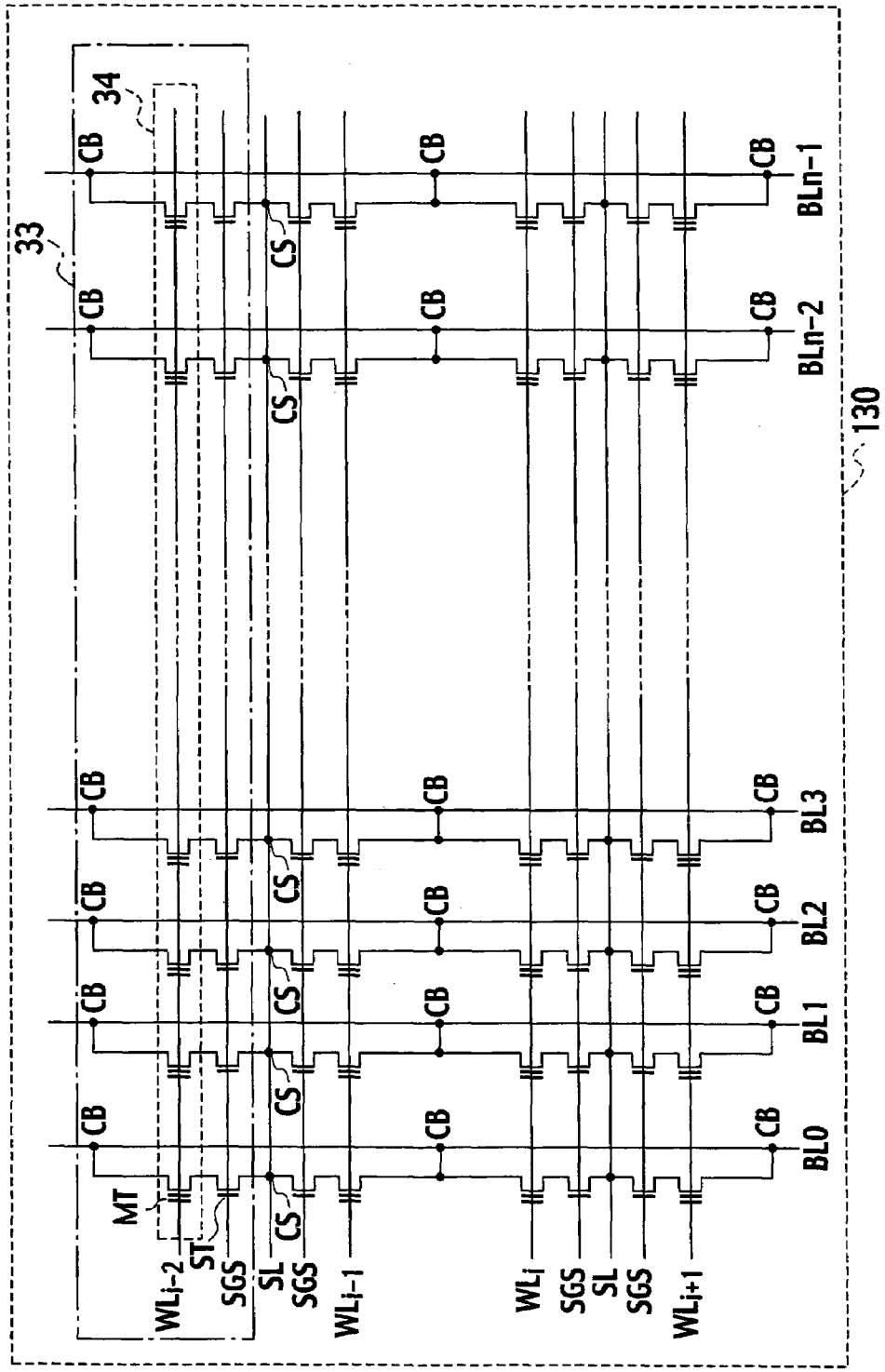
FIG. 24 schematically shows a two-transistor/cell type circuit structure of a memory cell array constituting a nonvolatile semiconductor memory according to a fifth embodiment of the present invention.

As shown in FIG. 24, a schematic circuit structure of a memory cell array 130, according to the fifth embodiment of the present invention, provides a circuit of a two-transistor/cell type nonvolatile semiconductor memory.

The exemplary semiconductor memory according to the fifth embodiment has a basic two-transistor/cell system structure and, as shown in FIG. 24, comprises a memory cell transistor MT and a select transistor ST.

The memory cell transistor MT comprises a stacked gate structure including a gate insulating film 2 formed as a tunnel insulating film on a p-well or semiconductor substrate 1, a floating gate 4, an inter-gate insulating film 12, and a control gate 7 arranged on the inter-gate insulating film 12. The drain region of the memory cell transistor MT is connected to a bit line contact (CB) via a diffusion layer, and the source region is connected to the drain region of the select transistor ST via the diffusion layer. The source region of the select transistor ST is connected to a source line contact (CS) via the diffusion layer. Such two-transistor/cell system memory cells are arranged in parallel along the length of the word line WL and, as shown in FIG. 24, comprise a memory cell block 33.

In a single memory cell block 33, the word line $WL_{i-2}$ is commonly connected to control gates 7 of respective memory cell transistors MT, comprising a page unit 34. Note that pages within multiple blocks may naturally be grouped into a page unit.

A select gate line SGS is commonly connected to the gates of the select transistors ST.

Circuitry having a two-transistor/cell system memory cells symmetrically arranged with the source line SL, as a line of symmetry, is serially arranged along the length of bit lines BL0, BL1, BL2, . . . , BLn−1.

It is apparent that the effects of improved lithographic margins at word line ends, as in the NAND nonvolatile semiconductor memory according to the first and the second embodiment, may also be expected for an interconnect pattern of word line ends in a memory cell array 130 comprising a two-transistor/cell type nonvolatile semiconductor memory according to the fifth embodiment of the present invention.

SIXTH EMBODIMENT (Three-Transistor/Cell Type)

Figure 25:
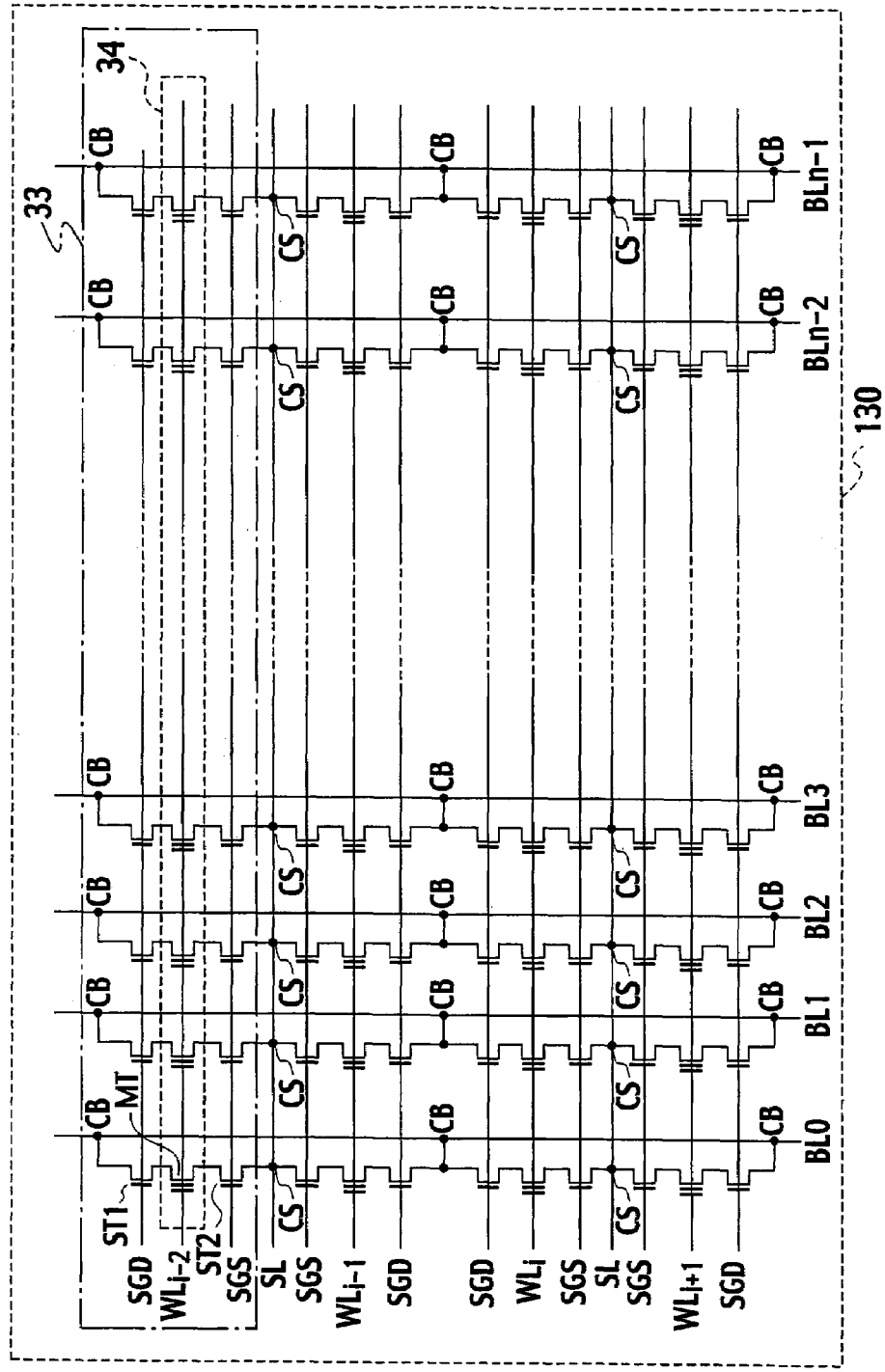
FIG. 25 schematically shows a three-transistor/cell type circuit structure of a memory cell array constituting a nonvolatile semiconductor memory according to a sixth embodiment of the present invention.

As shown in FIG. 25, a schematic circuit structure of a memory cell array 130, according to the sixth embodiment of the present invention, provides a circuit structure of a three-transistor/cell type nonvolatile semiconductor memory.

The exemplary semiconductor memory according to the sixth embodiment has a basic three-transistor/cell system structure, and, as shown in FIG. 25, comprises a memory cell transistor MT and select transistors ST1 and ST2.

The memory cell transistor MT comprises a stacked gate structure including a gate insulating film 2 formed as a tunnel insulating film on a p-well or semiconductor substrate 1, a floating gate 4, an inter-gate insulating film 12, and a control gate 7 arranged on the inter-gate insulating film 12.

The select transistors ST1 and ST2 are disposed on either side of the memory cell transistor MT, respectively. The drain region of the memory cell transistor MT is connected to a bit line contact (CB) via a bit line side select transistor ST1, and the source region is connected to a source line contact (CS) via a source line side select transistor ST2. Such three-transistor/cell system memory cells are arranged in parallel along the length of the word line WL, and, as shown in FIG. 25, and configure a memory cell block 33. In a single memory cell block 33, the word line $WL_{i-2}$ is commonly connected to control gates 7 of respective memory cells, configuring a page unit 34. Note that pages within multiple blocks may naturally be grouped into a page unit.

A select gate line SGS is commonly connected to the gates of the source line side select transistors ST2, and a select gate line SGD is commonly connected to the gates of the bit line side select transistors ST1. Circuitry having three-transistor/cell system memory cells symmetrically arranged with the source line SL as a line of symmetry is arranged in series along the length of bit lines BL0, BL1, BL2, . . . , BLn−1.

According to nonvolatile semiconductor memory of the fifth embodiment, medium operation between a NAND type and a NOR type semiconductor memory can be achieved.

It is apparent that the effects of improved lithographic margins at word line ends, as in the NAND nonvolatile semiconductor memory according to the first and the second embodiment, may also be expected for an interconnect pattern of word line ends in a memory cell array 130 comprising a three-transistor/cell type nonvolatile semiconductor memory according to the sixth embodiment of the present invention.

APPLICATION EXAMPLE

Figure 26:
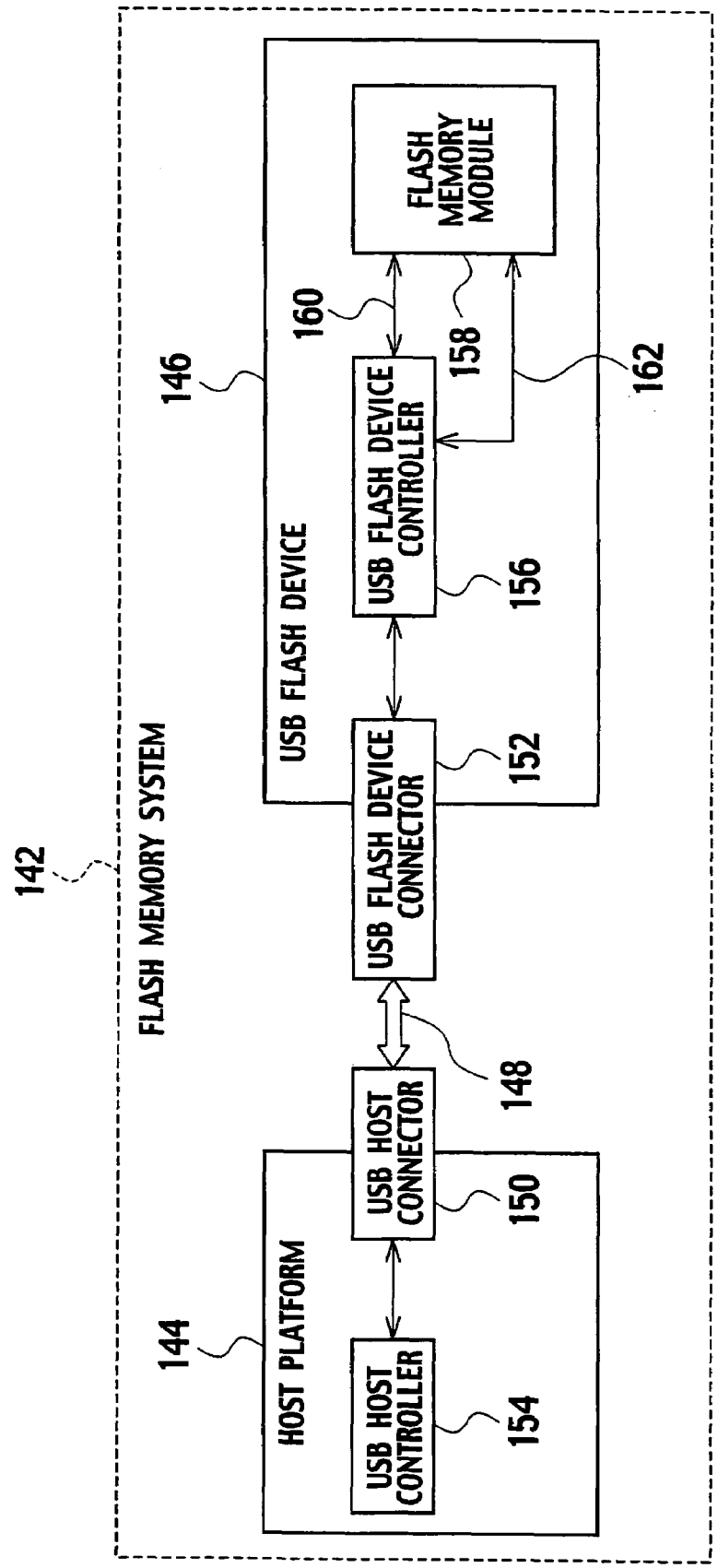
FIG. 26 schematically shows a block diagram of a flash memory unit and system as an exemplary application of the nonvolatile semiconductor memory according to the first through the sixth embodiment of the present invention.

FIG. 26 shows an application example of the semiconductor memory according to the first through the sixth embodiment of the present invention. FIG. 26 is a schematic diagram of principal elements of a flash memory device and system implemented by the semiconductor memory, particularly the nonvolatile semiconductor memory according to the embodiments of the present invention. As shown in the drawing, a flash memory system 142 comprises a host platform 144 and a universal serial bus (USB) flash unit 146.

The host platform 144 is connected to the USB flash unit 146 embedded with the nonvolatile semiconductor memory, according to the embodiments of the present invention, via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 comprises a USB flash unit controller 156, which controls other elements in the USB flash unit 146 and also controls the interface to the USB bus of the USB flash unit 146; the USB flash unit connector 152; and at least one flash memory module 158 comprising the nonvolatile semiconductor memory according to the first through the sixth embodiment of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/to the USB flash unit 146 via a FIFO buffer, referred to as an end point, that stores transfer data. The host platform 144 recognizes changes in the physical and electrical states, such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet through the USB cable 148. If the USB flash unit 146 is a unit including the end point that has received the request packet, the request is accepted by the USB flash unit controller 156.

Next, the USB flash unit controller 156 performs various operations such as read-in, write-in or erasure of data from or to the flash memory module 158. In addition, the USB flash unit controller 156 supports basic USB functions such as acquiring a USB address and the like. The USB flash unit controller 156 controls the flash memory module 158 via either a control line 160 used to control output from the flash memory module 158, or, for example, other various signals such as a chip enable signal CE, a read-out signal or a write-in signal. The flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the result and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148.

OTHER EMBODIMENTS

While the present invention has been described according to the first through the sixth embodiment, these embodiments and drawings constituting a part of this disclosure do not limit the scope of the present invention. This disclosure shows those skilled in the present invention a variety of embodiments, alternative embodiments, and operational technologies.

A stacked gate structure is disclosed as a standard element structure of a memory cell transistor of the nonvolatile semiconductor memory according to the first through the sixth embodiment, but the device is not limited to such stacked structure. Needless to say, a sidewall control gate structure or a MONOS structure is an alternative structure. In addition, needless to say, various modified examples and alternatives of the fabrication process are available.

Moreover, the memory cell transistor of the nonvolatile semiconductor memory according to the first through the sixth embodiment is not limited to a two-valued logic memory. For example, the present invention is applicable to multi-valued logic memory, such as a three or more valued logic memory. For example, a four-valued nonvolatile semiconductor memory may provide a memory capacity twice that of the two-valued nonvolatile semiconductor memory. In addition, the present invention is applicable to a multi (m)-valued nonvolatile semiconductor memory (where m is greater than 3).

As such, the present invention naturally includes various embodiments not described herein. Accordingly, the technical scope of the present invention should be defined by only the claims that appear appropriate from the aforementioned description.

Needless to say, the present invention includes a variety of embodiments or the like not disclosed herein. Therefore, the technical scope of the present invention should be defined by only inventive descriptions according to the claimed invention, which is appropriate according to the aforementioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation. Various modifications will become possible for those skilled in the art after receiving the teachings of the present disclosure without departing from the scope thereof.

What is claimed is:

1. A nonvolatile semiconductor memory comprising:
   a first and a second active area configured to extend in the column direction in parallel;
   an element isolating region configured to electrically separate the first and the second active area;
   a plurality of word lines configured to extend in the row direction and comprise respective main parts and respective ends;
   a plurality of memory cell transistors configured to be disposed on intersections between the respective main parts of the plurality of word lines and the second active area; wherein each memory cell transistor comprises a gate insulating film, a floating gate electrode, an inter-gate insulating film, and a control gate electrode, so as to comprise a memory cell array;
   a short-circuit region configured to electrically short circuit the ends of the plurality of word lines; and
   a trench configured to separate the ends from the main parts of the plurality of word lines.

2. The nonvolatile semiconductor memory of claim 1, wherein the short-circuit region is patterned at the same time as the word lines are patterned.

3. The nonvolatile semiconductor memory of claim 1, wherein the element isolating region and the floating gate electrode are formed on a self-aligned basis.

4. The nonvolatile semiconductor memory of claim 1, wherein the trench is formed right above the first active area.

5. The nonvolatile semiconductor memory of claim 1, wherein the trench is formed right above the element isolating region between the short-circuit region and the first active area.

6. The nonvolatile semiconductor memory of claim 1, wherein the memory cell array includes a NAND memory cell array circuit structure.

7. The nonvolatile semiconductor memory of claim 1, wherein the memory cell array includes an AND memory cell array circuit structure.

8. The nonvolatile semiconductor memory of claim 1, wherein the memory cell array includes a NOR memory cell array circuit structure.

9. The nonvolatile semiconductor memory of claim 1, wherein the memory cell array includes a two-transistor/cell type memory cell array circuit structure.

10. The nonvolatile semiconductor memory of claim 1, wherein the memory cell array includes a three-transistor/cell type memory cell array circuit structure.

11. A fabrication method for a nonvolatile semiconductor memory comprising: a first and a second active area configured to extend in parallel in the column direction; an element isolating region configured to electrically separate the first and the second active area; a plurality of word lines, which extend in the row direction and have respective main parts and respective ends; a plurality of memory cell transistors configured to be disposed on intersections between the respective main parts of the plurality of word lines and the second active area, where each memory cell transistor comprises a gate insulating film, a floating gate electrode, an inter-gate insulating film, and a control gate electrode, so as to comprise a memory cell array; a short-circuit region configured to electrically short circuit the ends of the plurality of word lines; and a trench configured to separate the ends from the main parts of the plurality of word lines; said fabrication method comprising:
    fabricating a stacked layer structure comprising a stacked nitride film, a metallic salicide film, the control gate electrode, the inter-gate insulating film, and the floating gate electrode, and short circuiting the ends of the plurality of word lines in the short-circuit region;
    coating a resist across the entire surface of an element region on a semiconductor substrate, and patterning the trench;
    etching the nitride film, the metallic salicide film, and the control gate electrode using the resist as a mask, and forming an aperture of the trench; and
    removing the resist.

12. The fabrication method of claim 11, wherein the short-circuit region is formed by patterning at the same time as patterning the word lines.

13. The fabrication method of claim 11, wherein the aperture of the trench is formed at the same time as patterning for an aperture of an inter-polysilicon capacitor on the periphery of the memory cell array.

14. The fabrication method of claim 11, wherein the aperture of the trench is formed at the same time as patterning for an aperture of a resistive element on the periphery of the memory cell array.

15. The fabrication method of claim 11, wherein the element isolating region and the floating gate electrode are formed on a self-aligned basis.

16. The fabrication method of claim 11, wherein the trench is formed right above the first active area.

17. The fabrication method of claim 11, wherein the trench is formed right above the element isolating region between the short-circuit region and the first active area.

18. The fabrication method of claim 11, wherein the control gate electrode and the floating gate electrode are polysilicon.

19. The fabrication method of claim 11, wherein the metallic salicide film is tungsten silicide.

20. The fabrication method of claim 11, wherein the memory cell array includes a NAND memory cell array circuit structure.

* * * * *